US006919288B2

(12) United States Patent
Yamamoto et al.

(10) Patent No.: US 6,919,288 B2
(45) Date of Patent: Jul. 19, 2005

(54) HARD FILM FOR CUTTING TOOLS, CUTTING TOOL COATED WITH HARD FILM, PROCESS FOR FORMING HARD FILM, AND TARGET USED TO FORM HARD FILM

(75) Inventors: Kenji Yamamoto, Kobe (JP); Toshiki Satou, Kobe (JP); Yasuomi Morikawa, Kobe (JP); Koji Hanaguri, Takasago (JP); Kazuki Takahara, Takasago (JP)

(73) Assignee: Kobe Steel, Ltd., Kôbe (JP)

( * ) Notice: Subject to any disclaimer, the term of this patent is extended or adjusted under 35 U.S.C. 154(b) by 0 days.

(21) Appl. No.: 10/879,365

(22) Filed: Jun. 30, 2004

(65) Prior Publication Data

US 2004/0237840 A1 Dec. 2, 2004

Related U.S. Application Data

(63) Continuation of application No. 10/025,653, filed on Dec. 26, 2001, now Pat. No. 6,824,601.

(30) Foreign Application Priority Data

| Dec. 28, 2000 | (JP) | 2000-402555 |
|---|---|---|
| Jun. 19, 2001 | (JP) | 2001-185464 |
| Jun. 19, 2001 | (JP) | 2001-185465 |
| Sep. 20, 2001 | (JP) | 2001-287587 |
| Oct. 5, 2001 | (JP) | 2001-310562 |

(51) Int. Cl.$^7$ .................. C23C 14/06; C04B 35/581
(52) U.S. Cl. ............ 501/98.4; 51/309; 106/286.2; 106/286.5; 106/287.1; 204/192.11; 204/192.15; 428/697; 428/698; 428/699
(58) Field of Search .................. 501/98.4; 51/309; 106/286.2, 286.5, 287.1; 204/192.11, 192.15; 428/697, 698, 699

(56) References Cited

U.S. PATENT DOCUMENTS

| 4,436,830 A | 3/1984 | Andreev et al. |
|---|---|---|
| 5,126,030 A | 6/1992 | Tamagaki et al. |
| 5,580,653 A | 12/1996 | Tanaka et al. |
| 5,700,551 A | 12/1997 | Kukino et al. |
| 5,882,778 A | 3/1999 | Sugizaki et al. |
| 5,981,416 A | * 11/1999 | Kume et al. ......... 501/96.1 |
| 6,033,734 A | 3/2000 | Muenz et al. |
| 6,033,768 A | 3/2000 | Muenz et al. |
| 6,071,560 A | 6/2000 | Braendle et al. |
| 6,220,797 B1 | 4/2001 | Ishii et al. |
| 6,231,969 B1 | 5/2001 | Knight et al. |
| 6,254,984 B1 | 7/2001 | Iyori |
| 6,416,262 B1 | 7/2002 | Ishimaru et al. |
| 6,492,011 B1 | 12/2002 | Brandle et al. |
| 6,565,957 B2 | 5/2003 | Nakamura et al. |

FOREIGN PATENT DOCUMENTS

| EP | 1 132 498 | 9/2001 |
|---|---|---|
| JP | 4-128363 | 4/1992 |
| JP | 7-188901 | 7/1995 |
| JP | 7-197235 | 8/1995 |
| JP | 7-237010 | 9/1995 |
| JP | 7-310174 | 11/1995 |
| JP | 8-209335 | 8/1996 |
| JP | 9-041127 | 2/1997 |
| JP | 2644710 (8-209333) | 8/1997 |
| JP | 9-256138 | 9/1997 |
| JP | 09-291353 | 11/1997 |
| JP | 09-295204 | 11/1997 |
| JP | 9-300105 | 11/1997 |
| JP | 09-300106 | 11/1997 |
| JP | 09-323204 | 12/1997 |
| JP | 9-323205 | 12/1997 |
| JP | 10-025566 | 1/1998 |
| JP | 10-251831 | 9/1998 |
| JP | 11-006056 | 1/1999 |
| JP | 11-036063 | 2/1999 |
| JP | 11-131215 | 5/1999 |
| JP | 11-131216 | 5/1999 |
| JP | 2901049 (8-134635) | 6/1999 |
| JP | 2000-038563 | 2/2000 |
| JP | 2000-144376 | 5/2000 |
| JP | 2000-328236 | 11/2000 |
| JP | 2001-172763 | 6/2001 |
| JP | 2001-234328 | 8/2001 |
| JP | 2001-254187 | 9/2001 |

OTHER PUBLICATIONS

A. Kimura, et al., Surface and Coatings Technology, vol. 120–121, pp. 438–441, "Effects of Al Content on Hardness, Lattice Parameter and Microstructure of $Ti_{1-x}Al_xN$ Films", 1999, no month provided.

A. Sugishima, et al., Surface and Coatings Technology, vol. 97, pp. 590–594, "Phase Transition of Pseudobinary Cr–Al–N Films Deposited by Magnetron Sputtering Method", 1997, no month provided.

Patent Abstracts of Japan, JP 2000–038653, Feb. 8, 2000.

Patent Abstracts of Japan, JP 08–260132, Oct. 8, 1996.

Patent Abstracts of Japan, JP 07–237010, Sep. 12, 1995.

W.–D. Muenz, et al., Surface Coatings Technology, vol. 125, No. 1–3, pp. 269–277, XP–001065416, "Properties of Various Large–Scale Fabricated TiAlN–and CrN–Based Superlattice Coatings Grown by Combined Cathodic Arc–Unbalanced Magnetron Sputter Deposition", Jun. 1999.

(Continued)

*Primary Examiner*—David Brunsman
(74) *Attorney, Agent, or Firm*—Oblon, Spivak, McClelland, Maier & Neustadt, P.C.

(57) ABSTRACT

A hard film for cutting tools which is composed of $(Ti_{1-a-b-c-d}, Al_a, Cr_b, Si_c, B_d) (C_{1-e}N_e)$
$0.5 \leq a \leq 0.8$, $0.06 \leq b$, $0 \leq c \leq 0.1$, $0 \leq d \leq 0.1$,
$0 \leq c+d \leq 0.1$, $a+b+c+d<1$, $0.5 \leq e \leq 1$ (where a, b, c, and d denote respectively the atomic ratios Al, Cr, Si, and B, and e denotes the atomic ratio of N.)

13 Claims, 5 Drawing Sheets

OTHER PUBLICATIONS

Patent Abstracts of Japan, JP 08-120445, May 14, 1996.
Patent Abstracts of Japan, JP 2000-297365, Oct. 24, 2000.
Steven R. Lampman, et al., ASM International Metals Handbook, vol. 2, Tenth Edition, XP-002203070, p. 1096, "Properties and Selection: Nonferrous Alloys and Special--Purpose Materials", 1990, no month provided.

J. Cueilleron, et al., Journal of the Less-Common Metals, vol. 65, No. 2, XP-002203069, pp. 167-173, "Purity of Boron Prepared by Vacuum Decomposition of Purified Boron Triiodide", Jun. 1979.

* cited by examiner

F I G. 5
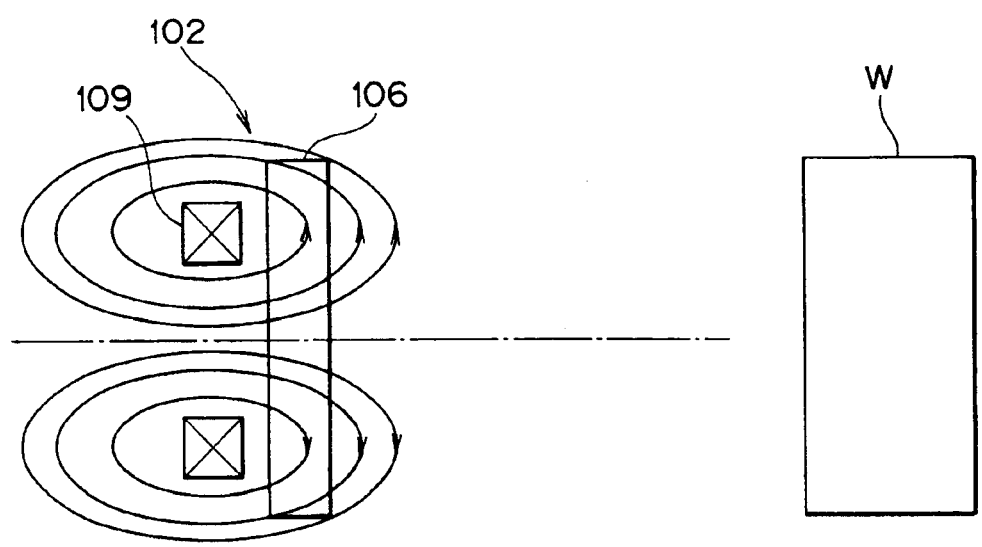

F I G. 6A
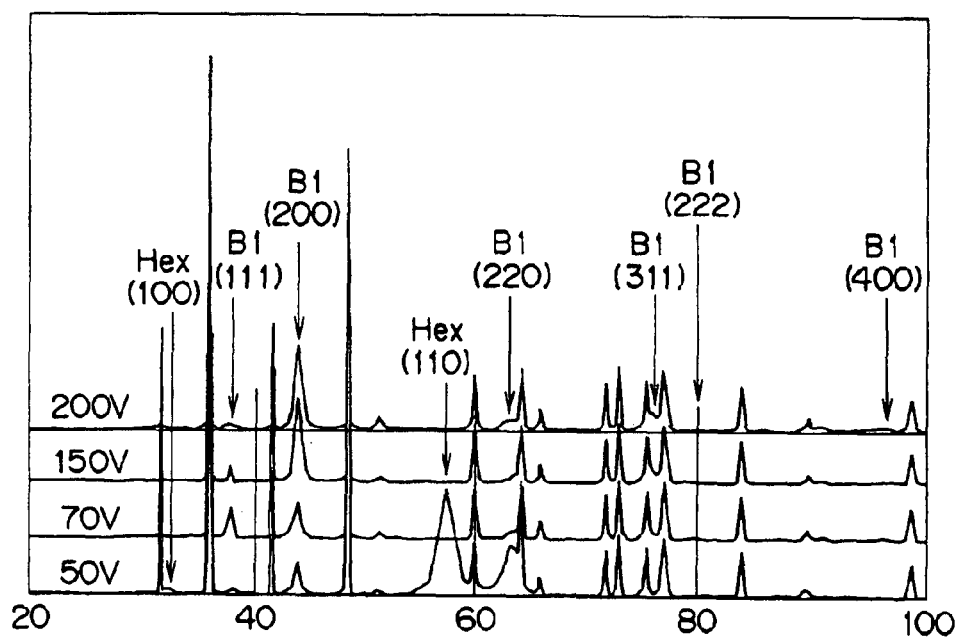
F I G. 6B
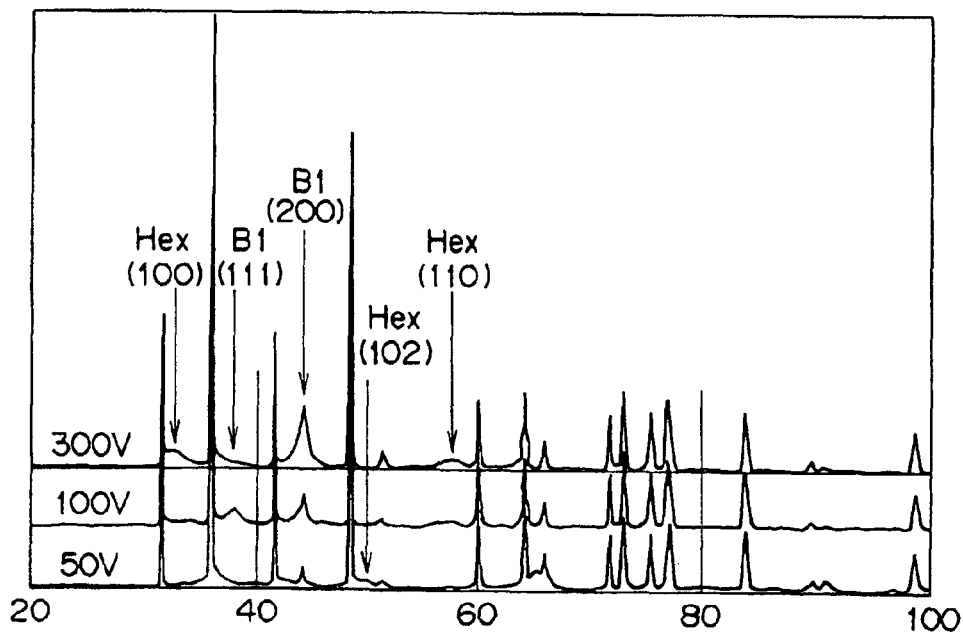

FIG. 7  THE POSITIVE VALUE OF STRESS INDICATES A COMPRESSIVE STRESS
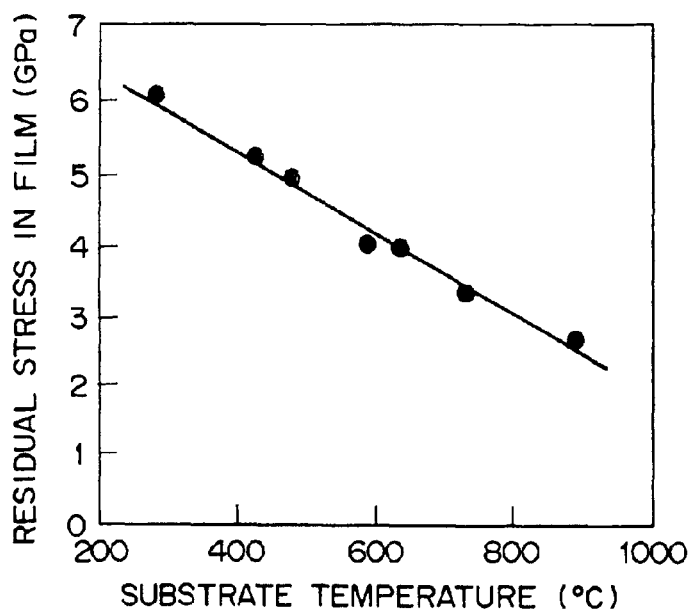
FIG. 8
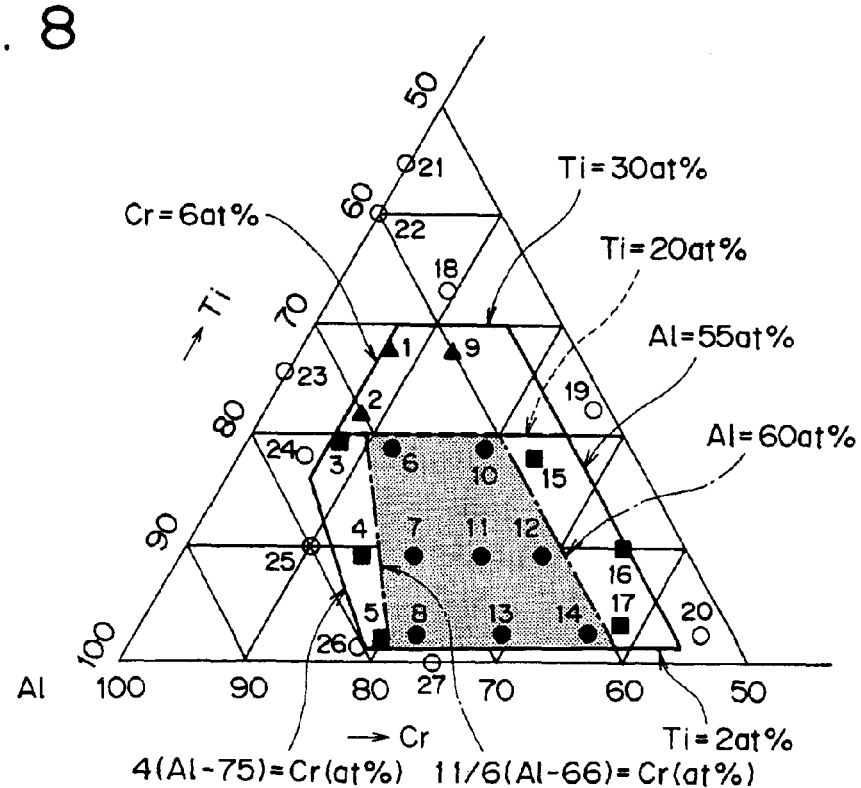

HARD FILM FOR CUTTING TOOLS, CUTTING TOOL COATED WITH HARD FILM, PROCESS FOR FORMING HARD FILM, AND TARGET USED TO FORM HARD FILM

This application is a continuation of U.S. application Ser. No. 10/025,653, filed on Dec. 26, 2001 now U.S. Pat. No. 6,824,601, which claims priority to JP 2001-287587, filed on Sep. 20, 2001, JP 2001-310562, filed on Oct. 5, 2001, JP 2000-402555, filed on Dec. 28, 2000, JP 2001-185465, filed on Jun. 19, 2001, and JP 2001-185464, filed on Jun. 19, 2001.

BACKGROUND OF THE INVENTION

1. Field of the Invention

The present invention relates to a hard film to improve the wear resistance of cutting tools such as tips, drills, and end mills, a cutting tool coated with said hard film which exhibits excellent wear resistance, a process for forming said hard film, and a target used as a vapor source to form said hard film.

2. Description of the Related Arts

It has been common practice to coat cutting tools made of cemented carbide, cermet, or high speed tool steel with hard film of TiN, TiCN, TiAlN, or the like for the purpose of improving their wear resistance.

Because of its excellent wear resistance as disclosed in Japanese Patent No. 2644710, the film of compound nitride of Ti and Al (referred to as TiAlN hereinafter) has superseded the film of titanium nitride, titanium carbide, or titanium carbonitride to be applied to cutting tools for high speed cutting or for high hardness materials such as quenched steel.

There is an increasing demand for hard film with improved wear resistance as the work material becomes harder and the cutting speed increases.

It is known that the above-mentioned TiAlN film increases in hardness and improves in wear resistance upon incorporation with Al. Japanese Patent No. 2644710 indicates that TiAlN precipitates soft AlN of ZnS structure when the Al content therein is such that the compositional ratio x of Al exceeds 0.7 in the formula $(Al_xTi_{1-x})N$ representing TiAlN. The foregoing patent also mentions that "if the Al content (x) exceeds 0.75, the hard film has a composition similar to that of AlN and hence becomes soft, permitting the flank to wear easily". In addition, the foregoing patent shows in FIG. 3 the relation between the compositional ratio of Al and the hardness of film. It is noted that the hardness begins to decrease as the compositional ratio of Al exceeds about 0.6. This suggests that AlN of ZnS structure begins to separate out when the compositional ratio of Al is in the range of 0.6–0.7 and AlN of ZnS structure separates out more as the compositional ratio of Al increases further, with the result that the hardness of film decreases accordingly. Moreover, the foregoing patent mentions that the TiAlN film begins to oxidize at 800° C. or above when the compositional ratio x of Al is 0.56 or higher, and this temperature rises according as the value x increases. The temperature which the TiAlN film withstands without oxidation is about 850° C. when the compositional ratio of Al is 0.75 (which is the upper limit for the TiAlN film to have adequate hardness).

In other words, the conventional TiAlN film cannot have both high hardness and good oxidation resistance because there is a limit to increasing hardness by increasing the compositional ratio of Al. Consequently, it is limited also in improvement in wear resistance.

At present, cutting tools are required to be used at higher speeds for higher efficiency. Cutting tools meeting such requirements need hard coating film which has better wear resistance than before.

OBJECT AND SUMMARY OF THE INVENTION

The present invention was completed in view of the foregoing. It is an object of the present invention to provide a hard film for cutting tools which is superior in wear resistance to TiAlN film and permits high-speed efficient cutting, a process for forming said hard film, and a target used to efficiently form a hard film for cutting tools by said process.

The present invention is directed to a hard film for cutting tools composed of $(Ti_{1-a-b-c-d}, Al_a, Cr_b, Si_c, B_d) (C_{1-e}N_e)$
$0.5 \leq a \leq 0.8$, $0.06 \leq b$, $0 \leq c \leq 0.1$, $0 \leq d \leq 0.1$,
$0 \leq c+d \leq 0.1$, $a+b+c+d<1$, $0.5 \leq e \leq 1$ (where a, b, c, and d denote respectively the atomic ratios of Al, Cr, Si, and B, and e denotes the atomic ratio of N. This is to be repeated in the following.)

The present invention includes preferred embodiments in which the value of e is 1, or the values of a and b are in the range of $0.02 \leq 1-a-b \leq 0.30$, $0.55 \leq a \leq 0.765$, $0.06 \leq b$, or
$0.02 \leq 1-a-b \leq 0.175$, $0.765 \leq a$, $4(a-0.75) \leq b$.

According to the present invention, the hard film for cutting tools should preferably be one which has the crystal structure mainly of sodium chloride structure. The sodium chloride structure should preferably be one which has the (111) plane, (200) plane, and (220) plane such that the intensity of diffracted rays from them measured by X-ray diffraction (θ–2θ method), which is denoted by I(111), I(200), and I(220), respectively, satisfies expression (1) and/or expression (2) and expression (3) given below.

$$I(220) \leq I(111) \quad (1)$$

$$I(220) \leq I(200) \quad (2)$$

$$I(200)/I(111) \leq 0.1 \quad (3)$$

In addition, the sodium chloride structure should preferably be one which, when measured by X-ray diffraction (θ–2θ method) with Cu Kα line, gives the diffracted ray from the (111) plane whose angle of diffraction is in the range of 36.5°–38.0°. Moreover, the diffracted ray from the (111) plane should preferably have a half width not larger than 1°.

The above-mentioned hard film for cutting tools can be used to obtain coated cutting tools with outstanding wear resistance.

The present invention is directed also to a process for forming the above-mentioned hard film for cutting tools. This process consists of vaporizing and ionizing a metal in a film-forming gas atmosphere and converting said metal and film-forming gas into a plasma, thereby forming a film. The process is an improved arc ion plating (AIP) method which consists of vaporizing and ionizing a metal constituting a target by arc discharge, thereby forming the hard film of the present invention on a substrate, wherein said improvement comprises forming the magnetic lines of force which:

a) are parallel to the normal at the target's evaporating surface, and b) run toward the substrate in the direction parallel to or slightly divergent from the normal to the target's evaporating surface, thereby accelerating the conversion of film-forming gas into a plasma by the magnetic lines of force. In this case, the bias voltage to be applied to the substrate should preferably be −50V to −400V with respect to earth potential. In addition, the substrate should preferably be kept at 300–800° C. while film is being formed thereon. The reactant gas for film forming should preferably have a partial pressure or total pressure in the range of 0.5–7 Pa.

Incidentally, the reactant gas used in the present invention denotes any one or more of gaseous nitrogen, methane, ethylene, acetylene, ammonia, and hydrogen, which contain elements necessary for coating film. The reactant gas may be used in combination with a rare gas such as argon, which is referred to as an assist gas. The reactant gas and the assist gas may be collectively referred to as a film-forming gas.

The present invention is directed also to a target used to form hard film which is composed of Ti, Al, Cr, Si, and B and has a relative density higher than 95%. The target should preferably contain no pores or pores with a radius smaller than 0.3 mm.

The target should have a composition defined by
$(Ti_{1-x-y-z-w}, Al_x, Cr_y, Si_z, B_w)$
$0.5 \leq x \leq 0.8$, $0.06 \leq y$, $0 \leq z \leq 0.1$, $0 \leq w \leq 0.1$,
$0 \leq z+w \leq 0.1$, $x+y+z+w<1$
(where x, y, z, and w denote respectively the atomic ratios of Al, Cr, Si, and B. This is to be repeated in the following.) In addition, if the value of (z+w) is 0, the values of x and y should preferably be in the ranged defined below.
$0.02 \leq 1-x-y \leq 0.30$, $0.55 \leq x \leq 0.765$, $0.06 \leq y$, or
$0.02 \leq 1-x-y \leq 0.175$, $0.765 \leq x$, $4(x-0.75) \leq y$.

Moreover, the target should preferably contain no more than 0.3 mass % oxygen, no more than 0.05 mass % hydrogen, no more than 0.2 mass % chlorine, no more than 0.05 mass % copper, and no more than 0.03 mass % magnesium.

BRIEF DESCRIPTION OF THE DRAWINGS

FIG. 5 is an enlarged schematic sectional diagram showing the important part of a conventional arc evaporating source.

FIG. 6 is an X-ray diffraction pattern of a film having a composition of $(Ti_{0.1}Al_{0.7}Cr_{0.2})N$. Part (1) is that of the film formed by using the evaporating source of the present invention. Part (2) is that of the film formed by using the conventional evaporating source.

FIG. 7 is a graph showing the relation between the substrate temperature and the residual stress in the film having a composition of $(Ti_{0.1}Al_{0.7}Cr_{0.2})N$.

FIG. 8 is a diagram showing the range of the composition of metallic components Ti, Al, and Cr of (Ti,Al,Cr)N film in Examples of the present invention.

DESCRIPTION OF THE PREFERRED EMBODIMENTS

Figure 1:
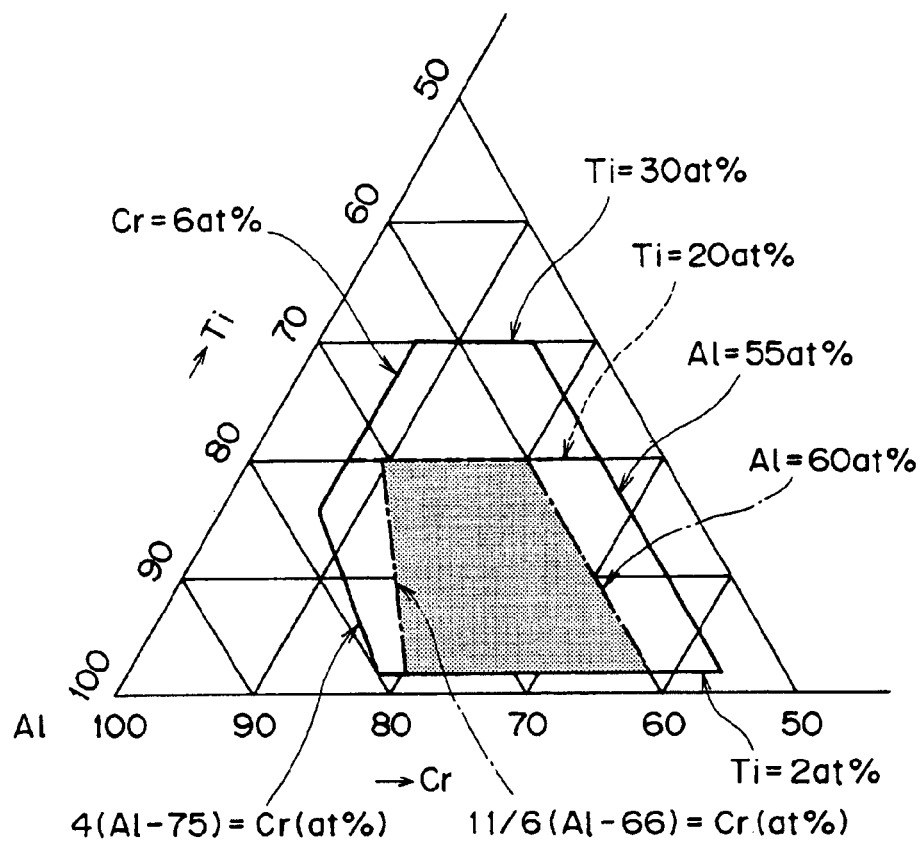
FIG. 1 is a triangular diagram showing the amount of metal components Ti, Al, and Cr in the (Ti,Al,Cr)N film.

Under the above-mentioned circumstances, the present inventors conducted extensive studies to realize a hard film for cutting tools which exhibits better wear resistance than before. As the result, it was found that the object is achieved if the film has both improved hardness and improved oxidation resistance. The present inventors continued their studies with their attention paid to TiAlN film. It was found that the TiAlN film is greatly improved in hardness and oxidation resistance and hence in wear resistance if it is incorporated with Cr. It was also found that the TiAlN film is improved further in oxidation resistance if it is incorporated with Si or B. Their quantitative investigations into the effect of these additives led to the present invention.

The gist of the present invention resides in a hard film composed of $(Ti_{1-a-b-c-d}, Al_a, Cr_b, Si_c, B_d)(C_{1-e}N_e)$
$0.5 \leq a \leq 0.8$, $0.06 \leq b$, $0 \leq c \leq 0.1$, $0 \leq d \leq 0.1$, $0 \leq c+d \leq 0.1$,
$a+b+c+d<1$, $0.5 \leq e \leq 1$
(where a, b, c, and d denote respectively the atomic ratios of Al, Cr, Si, and B, and e denotes the atomic ratio of N.) A detailed description is given below of the composition of the hard film.

TiAlN is a crystal of sodium chloride structure, or it is a compound nitride of sodium chloride structure composed of TiN in which the Ti site is replaced by Al. The fact that AlN of sodium chloride structure is in an equilibrium state at a high temperature under a high pressure suggests that it has a high hardness. Therefore, it would be possible to increase the hardness of TiAlN film if the ratio of Al in TiAlN is increased, with its sodium chloride structure maintained. However, AlN of sodium chloride structure is in a nonequilibrium state at normal temperature under normal pressure or at a high temperature under a low pressure. Consequently, ordinary gas-phase coating merely forms AlN of ZnS structure (which is soft) and never forms AlN of sodium chloride structure as a simple substance.

Nevertheless, it is possible to form TiAlN of sodium chloride structure at normal temperature under normal pressure or at a high temperature under a low pressure, if nitride film is formed by incorporation of Al into Ti, because TiN is of sodium chloride structure and has a lattice constant close to that of AlN of sodium chloride structure and hence AlN is assimilated into the structure of TiN. However, as mentioned above, if the amount of Al in TiAlN exceeds a certain limit which is defined by the compositional ratio (x) of 0.6–0.7 in $(Al_x,Ti_{1-x})N$ representing TiAlN, AlN of ZnS structure precipitates out because the effect of assimilation by TiN is weak.

Incidentally, it would be possible to increase the ratio of AlN of sodium chloride structure further if Ti in TiAlN is partly replaced by Cr, because CrN has a lattice constant which is closer to that of AlN of sodium chloride structure than that of TiN. If it is possible to increase the ratio of AlN of sodium chloride structure in the film by incorporation with Cr as mentioned above, it seems possible to make it harder than TiAlN film.

On the other hand, Japanese Patent Laid-open No. 310174/1995 discloses a method of increasing the hardness and oxidation resistance of TiAlN by incorporation with Si. The disclosed method requires that the amount of Al be no more than 0.75 (in atomic ratio) and the amount of Si be no more than 0.1 (in atomic ratio). If the amounts of Al and Si exceed the above-specified limits, the resulting film takes on the hexagonal crystal structure (which is soft). Therefore, further improvement in oxidation resistance is limited. By contrast, the present inventors found that it is possible to increase both oxidation resistance and hardness while maintaining the sodium chloride structure if the TiAlN film is incorporated with not only Cr but also Si. The behavior of Si is not yet elucidated; presumably, it occupies the position of Ti in the TiN lattice just as in the case of Al in TiAlN.

Incidentally, because AlN, CrN, and SiN excels TiN in oxidation resistance, it is desirable to add Al, Cr, and Si more rather than Ti from the view point of improving oxidation resistance.

A detailed explanation is given below of the reason why the atomic ratios a, b, c, d, and e have been established for Ti, Al, Cr, Si, B, and C constituting the film of $(Ti_{1-a-b-c-d}, Al_a, Cr_b, Si_c, B_d)(C_{1-e}N_e)$.

First, Al should be added such that the lower limit and the upper limit of its atomic ratio (a) is 0.5 and 0.8, respectively, because a minimum amount of Al is necessary to secure oxidation resistance and hardness and an excess amount of Al precipitates soft hexagonal crystals, thereby lowering the hardness of film.

Cr permits the Al content to be increased while keeping the sodium chloride structure as mentioned above. For this effect, Cr should be added such that the lower limit of its atomic ratio (b) is 0.06.

The atomic ratio (a) of Al should be 0.55 or above, preferably 0.60 or above. The lower limit of the atomic ratio (b) of Cr should preferably be 0.08. In the case where the atomic ratio (a) of Al exceeds 0.765, the atomic ratio (b) of Cr should preferably be within the range mentioned below. In addition, since CrN is less hard than TiN, Cr will reduce hardness if added excessively. Thus, the upper limit of the atomic ratio (b) of Cr should be 0.35, preferably 0.3.

FIG. 1 is a triangular diagram showing the amount of metal components Ti, Al, and Cr in the (Ti,Al,Cr)N film. On the left-hand side of line b=4(a−0.75) or in the area where b<4(a−0.75), the film hardness steeply decreases because AlN in the film contains crystals of ZnS structure (which is soft) in higher ratio even though Cr is added. Therefore, in the case where the atomic ratio (a) of Al exceeds 0.765, the ratio of Cr should preferably be b≧4(a−0.75).

Si produces the effect of improving oxidation resistance, as mentioned above. B also produces a similar effect. Therefore, Si and/or B should be added such that their atomic ratio (c+d) is 0.01 or above, preferably 0.02 or above. On the other hand, excess Si and/or B separate out in the form of soft hexagonal crystals, thereby impairing wear resistance. Si and/or B should be added such that the upper limit of their atomic ratios (c) and (d) or (c+d) is 0.1, preferably 0.07 or less, more preferably 0.05 or less.

Incidentally, silicon nitride forms a compact protective film of silicon oxide in an oxidizing atmosphere at high temperatures, thereby protecting the coating film from oxidation. On the other hand, boron nitride is inherently superior in oxidation resistance (with its oxidation starting at about 1000° C.); however, its oxide is poor in protecting power once oxidation has started. That is to say, boron is slightly inferior to silicon in oxidation resistance. Therefore, it is desirable to add silicon alone instead of adding silicon and boron in combination.

The amount of Ti is determined by the amount of Al, Cr, Si, and B. TiN is harder than CrN, and the film will have a low hardness if Ti is not added at all. Consequently, Ti should be added such that the lower limit of its atomic ratio (1−a−b−c−d) is 0.02, preferably 0.03. In the case where the atomic ratio of Al is 0.6 or above, the preferred amount of Ti is such that its atomic ratio is 0.35 or less, preferably 0.3 or less, because an excess amount of Ti relatively decreases the amount of Cr, thereby reducing the above-mentioned effect of assimilation.

Incidentally, in the case where Si and B are not contained or the value of (c+d) is 0, the amount of Ti, Al, and Cr should be such that the values of (a) and (b) are within the range specified below.

0.02≦1−a−b−0.30, 0.55≦a≦0.765, 0.06≦b, or
0.02≦1−a−b≦0.175, 0.765≦a, 4(a−0.75)≦b.

If the atomic ratio of Ti is less than 0.20, the resulting film has much improved oxidation resistance, with the result that the temperature at which the film begins to oxidize increases. Therefore, the values of (a) and (b) in the range defined below is desirable.

0.02≦1−a−b<0.20, 0.55≦a≦0.765, 0.06≦b, or
0.02≦1−a−b<0.20, 0.765≦a, 4(a−0.75)≦b.

If the atomic ratio (b) of Al is 0.6 or above and the upper limit of the atomic ratio (b) of Al is such that the resulting film is composed solely of crystals of sodium chloride structure, the result is not only good oxidation resistance but also higher hardness than $Ti_{0.4}Al_{0.6}N$ would have. (It is to be noted that $Ti_{0.4}Al_{0.6}N$ has the highest hardness among those compounds represented by TiAlN in which 0.56≦Al≦0.75).

Therefore, the most desirable range of (a) and (b) is as follows.

0.02≦1−a−b<0.20, 0.60≦a≦0.709, or
0.02≦1−a−b<0.20, 0.709≦a, 11/6×(a−0.66)≦b.

The above-mentioned preferred range is recommended particularly when the value of (c+d) is 0.

As in the case mentioned above, the upper limit of the atomic ratio (b) of Cr should preferably be 0.35, preferably 0.3, because CrN is less hard than TiN and excessive Cr lowers hardness.

Incorporation of C into the film causes hard carbides (such as TiC, SiC, and $B_4C$) to separate out, thereby making the film harder. The amount (1−e) of C should preferably equal the total amount (1−a−b) of Ti, Si, and B. Excessive C causes chemically unstable $Al_4C_3$ and $Cr_7C_3$ to separate out, thereby deteriorating oxidation resistance. Therefore, C should be added such that the value of (e) in $(Ti_{1-a-b-c-d}, Al_a, Cr_b, Si_c, B_d)(C_{1-e}N_e)$ is 0.5 or above, preferably 0.7 or above, more preferably 0.8 or above, and most desirably 1.

Incidentally, the hard film of the present invention should preferably be composed mainly of crystals of sodium chloride structure, because it loses high strength if it contains crystals of ZnS structure.

The crystal in which the sodium chloride structure dominates is one which has the peak intensity of X-ray diffraction (θ−2θ method) defined by expression (4) below, whose value is 0.5 or above, preferably 0.8 or above.

$$[IB(111) + IB(200) + IB(220) + IB(311) + IB(222) + IB(400)] / \quad (4)$$

$$[IB(111) + IB(200) + IB(220) + IB(311) + IB(222) + IB(400) +$$

$$IH(100) + IH(102) + IH(110)]$$

(where IB(111), IB(200), IB(220), IB(311), IB(222), and IB(400) represent respectively the peak intensity due to (111) plane, (200) plane, (220) plane, (311) plane, (222) plane, and (400) plane of sodium chloride structure, and IH(100), IH(102), and IH(110) represent respectively the peak intensity due to (100) plane, (102) plane, and (110) plane of ZnS structure.)

If the value of expression (4) is less than 0.5, the resulting film has a hardness lower than that which is regarded as desirable in the present invention.

The peak intensity of ZnS structure is measured by using an X-ray diffractometer which emits Cu Kα line. The peak intensity is one which appears at 2θ=32−33° for (100) plane, at 2θ=48−50° for (102) plane, or at 2θ=57−58° for (110) plane. Incidentally, although the crystal of ZnS structure is composed mainly of AlN, its peak position actually measured is slightly different from that shown in JCPDS cards because it contains Ti, Cr, Si, and B.

The film of the present invention should preferably have the sodium chloride structure such that the peak intensity measured by X-ray diffraction satisfies the following. $I(220) \leq I(111)$ and/or $I(220) \leq I(200)$ The reason for this is that the film has good wear resistance when the (111) plane or (200) plane (which is the closely packed plane of sodium chloride structure) is parallel to the film surface.

The ratio of $I(200)/I(111)$ should preferably be 0.1 or above (where I(200) denotes the peak intensity due to (200) plane and I(111) denotes the peak intensity due to (111) plane). This ratio varies in the range of about 0.1 to 5 depending on film-forming conditions, such as bias voltage applied to the substrate, gas pressure, and film-forming temperature. It was found in this invention that the film exhibits good cutting characteristics when the ratio is 0.1 or above. A probable reason for this is as follows. It is considered that in the crystal of sodium chloride structure, metal elements basically combine with nitrogen or carbon and there are very few metal-metal bonds, nitrogen-nitrogen bonds, and carbon-carbon bonds. Thus, metal atoms adjoin metal atoms, nitrogen atoms adjoin nitrogen atoms, and carbon atoms adjoin carbon atoms in the (111) plane, whereas metal atoms adjoin nitrogen atoms or carbon atoms in the (200) plane. There is a high possibility that metal atoms combine with nitrogen atoms or carbon atoms in the (200) plane, and this leads to a good stability. Thus, it is expected that if the stabler (200) plane is oriented at a certain ratio with respect to the (111) plane, the resulting film has increased hardness and exhibits improved cutting characteristics. The value of $I(200)/I(111)$ should be 0.3 or above, preferably 0.5 or above.

The angle of diffraction due to (111) plane varies depending on the film composition, the state of residual stress, and the kind of substrate. The results of X-ray diffraction (θ–2θ method) with Cu Kα line indicate that the hard film of the present invention varies in the angle of diffraction in the range of about 36.5–38.0° and that the angle of diffraction tends to decrease as the amount of Ti increases in the film. A probable reason why the angle of diffraction due to (111) plane decreases (or the distance between (111) planes increases) with the increasing amount of Ti in the film is that the lattice constant (4.24 Å) of TiN is larger than the lattice constant (4.12 Å) of AlN and the lattice constant (4.14 Å) of CrN of sodium chloride structure, as mentioned above. Incidentally, when the hard film of the present invention, which has the composition of $(Ti_{0.12}Al_{0.70}Cr_{0.15}Si_{0.03})N$, was formed on a cemented carbide substrate, the angle of diffraction due to (111) plane varies in the range of 36.6–37.1° depending on the film-forming conditions.

The angle of diffraction due to (111) plane of sodium chloride structure can be calculated from the following Bragg's formula (5).

$$2 \times (\text{spacing of lattice planes, Å}) \times \sin(\text{angle of diffraction } 2\theta/2) = \text{wavelength of X-rays used (Å)} \quad (5)$$

The wavelength of X-rays is 1.54056 Å for Cu Kα line. Incidentally, the spacing of (111) planes in expression (5) can be calculated from the following expression (6) which is obtained by using the law of mixture from the standard lattice constants (4.24 Å, 4.12 Å, and 4.14 Å) and the compositional ratio of TiN, AlN, and CrN of sodium chloride structure.

$$\text{Spacing of (111) planes (Å)} = [2.4492 \times Ti(at\%) + 2.379 \times Al(at\%) + 2.394 \times Cr(at\%)]/100 \quad (6)$$

(The amount of each element is expressed in terms of 100% metallic element.)

In the case where the hard film of the present invention, which has the composition of $(Ti_{0.1}Al_{0.72}Cr_{0.18})N$, is formed on a cemented carbide substrate, the angle of diffraction obtained from the above-mentioned expression (5) is 37.6°. In actual, however, the angle of diffraction varies in the range of 37.2–37.7° depending on the film-forming conditions and residual stress. The hard film of the present invention in its as-formed state receives compressive stress and hence the spacing of lattice planes parallel to the substrate is larger (due to Poisson effect) than that in the normal state or that calculated form the above-mentioned expression (6). Therefore, the angle of diffraction due to (111) plane measured by X-ray diffraction (θ–2θ method) was smaller than that in the normal state or that calculated from the above-mentioned expression (5) by substituting the spacing of lattice plane in the normal state obtained from the above-mentioned expression (6).

It is desirable that the angle of diffraction due to (111) plane obtained by X-ray diffraction (θ–2θ method) with Cu Kα line should be within ±0.3° of the standard angle of diffraction which is calculated from the above-mentioned expressions (5) and (6) on the basis of the composition of metallic elements in the film.

The diffraction peak due to (111) plane has the property that its half width varies depending on crystal size in the film and non-uniform residual stress in the film and crystals in the film tend to become small as the half width increases. [Half width usually denotes FWHM (Full Width Half Maximum) which is the width of that part of diffraction peak at which the intensity is half the maximum intensity of the diffraction peak.] This half width is about from 0.2° to 1° in the case of the hard film which satisfies the requirements of the present invention. In the case of hard film represented by $(Ti_{0.1}Al_{0.72}Cr_{0.18})N$ (mentioned above), the half width ranges from 0.3° to 0.8° depending on the film-forming conditions.

The hard film of the present invention may be used in the form of single-layer film which meets the above-mentioned requirements. It may also be used in the form of multi-layer film, each layer being mutually different and satisfying the above-mentioned requirements. The (Ti,Cr,Al,Si,B)(CN) film specified in the present invention, which is in the form of single layer or multiple layers, may have on its one side or both sides at least one layer composed of crystals in which the sodium chloride structure dominates, which is selected from the group consisting of a layer of metal nitride, a layer of metal carbide, and a layer of metal carbonitride (which differ from the above-mentioned hard film in composition).

Incidentally, the "crystal in which the sodium chloride structure dominates" denotes the same one as defined above, which has the peak intensity of X-ray diffraction (θ–2θ method) defined by expression (4) given above, whose value is 0.8 or above. (with IB(111), IB(200), IB(220), IB(311), IB(222), and IB(400) representing respectively the peak intensity due to (111) plane, (200) plane, (220) plane, (311) plane, (222) plane, and (400) plane of sodium chloride structure, and IH(100), IH(102), and IH(110) representing respectively the peak intensity due to (100) plane, (102) plane, and (110) plane of ZnS structure.) The layers of metal nitride, metal carbide, and metal carbonitride (which are of sodium chloride structure and differ from the above-mentioned hard film in composition) include, for example, those films of TiN, TiAlN, TiVAlN, TiCN, TiAlCN, TiNbAlCN, and TiC.

The hard film for cutting tools according to the present invention may have on its one side or both sides, in addition to the above-mentioned one or more layers, one or more layers of metal or alloy containing at least one metal selected from the group consisting of 4A Group elements, 5A Group elements, 6A Group elements, Al, and Si. The metals belonging to 4A Group, 5A Group, and 6A Group include Cr, Ti, and Nb. The alloy includes Ti—Al. Such laminated film structure is effective for substrates made of ferrous material (such as HSS and SKD) which are inferior to those of cemented carbide in adhesion to the hard film. The hard film with good adhesion to the substrate is obtained by sequentially forming on the above-mentioned ferrous substrate the above-mentioned film of Cr, TiN, or TiAlN (which is less hard than the hard film specified in the present invention), an intermediate metal layer of Cr, Ti, or Ti—Al, and the hard film of the present invention. The intermediate layer which is relatively softer than the hard film of the present invention reduces residual stress, thereby improving adhesion (peel resistance).

In the case where the hard film of the present invention consists of more than one layer, each layer may have a thickness in the range of 0.005–2 $\mu$m; however, the hard film of the present invention should preferably have a total thickness of from 0.5 $\mu$m to 20 $\mu$m regardless of whether it is of single-layer structure or composed of more than one layer. The multiple-layer structure may be formed from (i) mutually different films each satisfying the requirements of the present invention, (ii) layers of metal nitride, metal carbide, or metal carbonitride which are of sodium chloride structure and different from the above-mentioned hard film in composition, and (iii) layers of metal or alloy containing at least one metal selected from the group consisting of 4A Group elements, 5A Group elements, 6A Group elements, Al, and Si. With a total thickness less than 0.5 $\mu$m, the resulting hard film is too thin to have sufficient wear resistance. With a total thickness more than 20 $\mu$m, the resulting hard film is liable to break or peel during cutting. Therefore, a more preferable thickness is 1 $\mu$m or more and 15 $\mu$m or less.

Incidentally, the cutting tools to be coated with the hard film of the present invention include end mills, drills, hobs, and throw-away inserts which are made of cemented carbide, high speed steel (HSS), cermet, or CBN sintered body. Recently, cutting tools are used under severer conditions than before as the work becomes harder and the cutting speed increases, and hence the coating film for them is required to have higher hardness and better oxidation resistance. The hard film of the present invention satisfies both of these requirements. It is most suitable for those cutting tools which are used under dry or semi-dry cutting conditions. The conventional typical film of TiAlN does not exhibit sufficient oxidation resistance and hardness under dry cutting conditions (in which the temperature is considerably high). This drawback is overcome by the film of the present invention which has both high hardness and good oxidation resistance.

The film of the present invention, whose crystal structure is dominated substantially by sodium chloride structure despite its high Al content, may be formed effectively by the process specified in the present invention. This process consists of vaporizing and ionizing a metal constituting a target by arc discharge in a film-forming gas atmosphere and converting said metal and film-forming gas into a plasma, thereby forming a film. The process should preferably be carried out in such a way as to accelerate the conversion of film-forming gas into a plasma by the magnetic lines of force which:

a) are parallel to the normal at the target's evaporating surface, and b) run toward the substrate in the direction parallel to or slightly divergent from the normal to the target's evaporating surface.

The arc ion plating (AIP) apparatus used in the process of the present invention differs from the conventional one, in which the source of magnetic field is placed behind the target and the component of magnetic field perpendicular to the target film is small. The apparatus used to form the hard film of the present invention is constructed such that the magnet is placed beside or in front of the target so that magnetic lines of force diverge approximately perpendicularly to or extend parallel to the evaporating surface of the target. The magnetic lines of force accelerate the conversion of the film-forming gas into a plasma. This is very effective in forming the hard film of the present invention.

Figure 2:
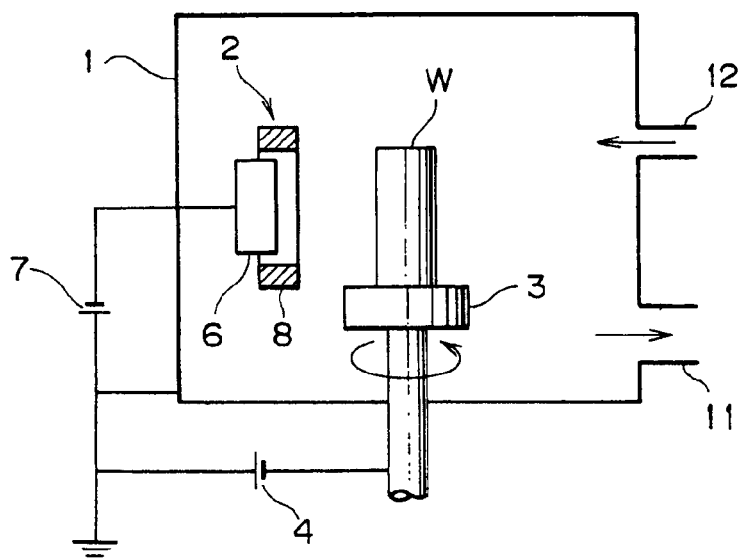
FIG. 2 is a schematic diagram showing an example of the arc ion plating (AIP) apparatus used to practice the present invention.

An example of the AIP apparatus used to practice the present invention is shown in FIG. 2. A brief description of the AIP apparatus is given below.

The AIP apparatus consists of a vacuum chamber 1 (which has an evacuating port 11 connected to a vacuum pump and a supply port 12 to feed a film-forming gas), an arc-vaporizing source 2 which vaporizes and ionizes by arc discharge a target constituting a cathode, a holder 3 to hold a substrate W (cutting tool) to be coated, and a bias power source 4 to apply through the holder 3 a negative bias voltage to the substrate W across the holder 3 and the vacuum chamber 1.

The arc-vaporizing source 2 is provided with a target 6 constituting a cathode, an arc power source 7 connected to the target 6 and the vacuum chamber 1 constituting an anode, and a permanent magnet 8 to generate a magnetic field forming magnetic lines of force which diverge approximately perpendicularly to or extend parallel to the evaporating surface of the target and reach the vicinity of the substrate W. The magnetic field should be such that its magnetic flux density is higher than 10 G (Gauss), preferably higher than 30 G, at the center of the substrate. Incidentally, the term "approximately perpendicularly to the evaporating surface" means an angle of from 0° to about 30° with respect to the normal to the evaporating surface.

Figure 3:
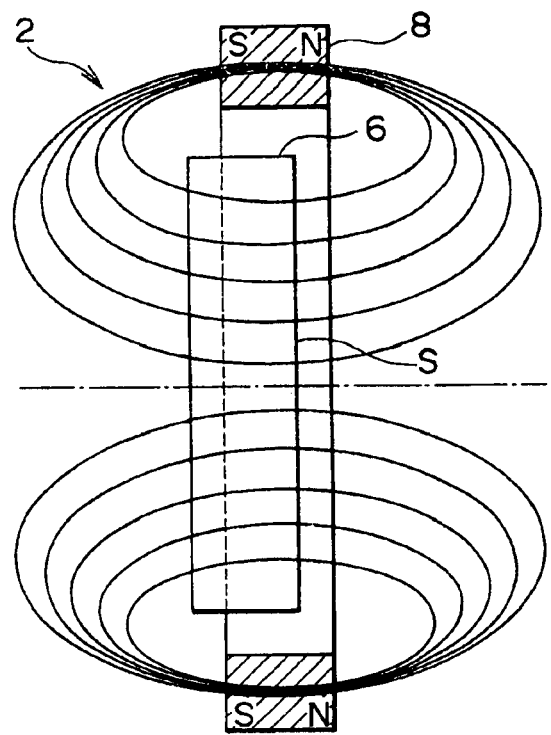
FIG. 3 is an enlarged schematic sectional diagram showing the important part of the arc evaporating source used to practice the present invention.
Figure 4:
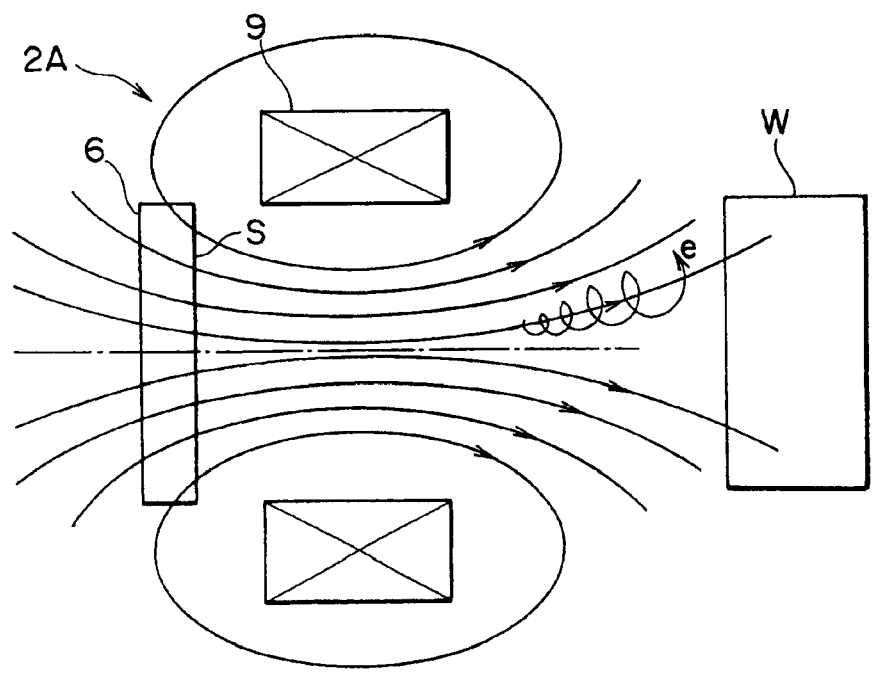
FIG. 4 is an enlarged schematic sectional diagram showing the important part of another arc evaporating source used to practice the present invention.

FIG. 3 is an enlarged sectional schematic diagram showing the important part of the arc evaporating source used to practice the present invention. The above-mentioned magnet 8 to generate a magnetic field is so arranged as to surround the evaporating surface S of the target 6. The magnet is not a sole means to generate a magnetic field; it may be replaced by an electromagnet consisting of a coil and an electric source. Alternatively, the magnet may be so placed as to surround the front (facing the substrate) of the evaporating surface S of the target 6, as shown in FIG. 4. Incidentally, although the vacuum chamber in FIG. 1 functions as an anode, it is also possible to provide a special cylindrical anode which surrounds the side front of the target.

Incidentally, FIG. 5 shows a conventional AIP apparatus, in which the arc evaporating source 102 is provided with an electromagnet 109 to concentrate the arc discharge onto the target 106. However, since the electromagnet 109 is placed behind the target 106, the magnetic lines of force become parallel to the target surface in the vicinity of the target evaporating surface and hence do not reach the vicinity of the substrate W.

The arc evaporating source of the AIP apparatus used in the present invention differs from the conventional one in the structure of magnetic field and hence in the way the plasma of film-forming gas expands.

The evaporating source shown in FIG. 4 converts the film-forming gas into plasma as the result of arc-induced electrons (e) partly winding around the magnetic line of force and colliding with nitrogen molecules constituting the film-forming gas. By contrast, the conventional evaporating source 102 shown in FIG. 5 works differently. That is, the magnetic lines of force are confined near the target and hence the plasma of film-forming gas generated as mentioned above has the highest density near the target and a low density near the substrate W. However, in the case of the evaporating source shown in FIGS. 3 and 4, which is used in the present invention, the magnetic line of force reach the substrate W, so that the plasma of film-forming gas has a much higher density near the substrate W than that in the case of conventional evaporating source. It is considered that the different in plasma density affects the crystal structure of the film formed.

An example of such effects actually observed is shown in FIG. 6, which is an X-ray diffraction pattern of a Ti—CrAlN film (having a composition of $(Ti_{0.1}Cr_{0.2}Al_{0.7})N$) which was prepared by using the conventional evaporating source and the improved evaporating source of the present invention. In FIG. 6 "B1" represents the sodium chloride structure and "Hex" represents the ZnS structure and "( )" represents the crystal plane. In addition, unmarked peaks in FIG. 6 are ascribed to the substrate (cemented carbide). Both of the evaporating sources were operated to form film samples under the following conditions. Arc current: 100 A, pressure of nitrogen gas: 2.66 Pa, substrate temperature: 400° C., and bias voltage for substrate: varied from 50V to 300V. Incidentally, the bias voltage is negative with respect to earth potential. Thus, a bias voltage of 100V, for example, means a bias voltage which is −100V with respect to earth potential.

The evaporating source of the conventional AIP apparatus, in which the magnet is placed behind the target, yields a film which is composed of mixed phases of cubic system (sodium chloride structure) and hexagonal system (ZnS structure) even when the bias voltage is increased to 300V, as shown in FIG. 6(2). By contrast, the evaporating source of the AIP apparatus of the present invention, in which the magnet is placed beside the target, yields a film which is composed of single phase of sodium chloride structure when the bias voltage is 70V or higher with respect to earth potential, as shown in FIG. 6(1).

AlN of sodium chloride structure is inherently in a non-equilibrium state at normal temperature under normal pressure, and hence it is a substance which does not form readily. Nevertheless, it is considered that the evaporating source of the present invention actively converts nitrogen into plasma and the resulting high-energy nitrogen particles help to form the AlN of sodium chloride structure in a non-equilibrium state.

The higher is the bias voltage, the higher becomes the energy of film-forming gas and metal ions which have been converted into plasma, and the crystals of the film take on sodium chloride structure more readily. Consequently, the bias voltage should be 50V or higher, preferably 70V or higher, and more preferably 100V or higher. However, an excessively high bias voltage is not practical because the film is etched by the film-forming gas which has been converted into plasma and hence the film-forming rate is extremely small. Consequently, the bias voltage should be 400V or lower, preferably 300V or lower, more preferably 260V or lower, and most desirably 200V or lower. Incidentally, the bias voltage is negative with respect to earth potential. Thus, a bias voltage of 100V, for example, means a bias voltage which is −100V with respect to earth potential. The object of applying a bias voltage is to impart energy to the incident film-forming gas and metal ions from the target, thereby allowing the film to take on the sodium chloride structure. The preferred range of the bias voltage varies depending on the composition of the film to be formed. In the case of film with a comparatively low Al content or a comparatively high Cr content, a comparatively low bias voltage will work owing to the above-mentioned assimilating effect which contribute to sodium chloride structure. If the Al content is less than about 65 atom % or the Cr content is more than about 25 atom %, it is possible to obtain a single-layer film of sodium chloride structure even when the bias voltage is 70V or lower.

According to the present invention, the substrate temperature should be in the range of 300–800° C. at the time of film forming. This is related with the stress of the resulting film.

FIG. 7 is a graph showing the relation between the substrate temperature and the residual stress of the resulting film having a composition of $(Ti_{0.1}Al_{0.7}Cr_{0.2})N$. The film was formed under the following conditions. Arc current: 100 A, bias voltage for the substrate: 150V, and pressure of nitrogen gas: 2.66 Pa.

It is noted from FIG. 7 that the residual stress in the resulting hard film decreases according as the substrate temperature increases. The resulting film with excessive residual stress is poor in adhesion and liable to peeling. Consequently, the substrate temperature should be 300° C. or higher, preferably 400° C. or higher. On the other hand, the higher the substrate temperature, the less the residual stress. However, the film with excessively small residual stress is poor in compressive strength and hence less effective in increasing the resistance of the substrate to bending. It also causes thermal change to the substrate due to high temperature. Consequently, the substrate temperature should be 800° C. or lower, preferably 700° C. or lower.

In the case where the substrate is cemented carbide, the above-mentioned substrate temperature is not specifically restricted. However, in the case where the substrate is high speed tool steel (such as JIS-HSS and JIS-SKH51) and hot work tool steel (such as JIS-SKD11 and JIS-SKD61), the substrate temperature at the time of film forming should be lower than the tempering temperature so that the substrate retains its mechanical properties. The tempering temperature varies depending on the substrate material; it is about 550–570° C. for JIS-SKH51, 550–680° C. for JIS-SKD61, and 500–530° C. for JIS-SKD11. The substrate temperature should be lower than the tempering temperature, preferably lower than the tempering temperature by about 50° C.

According to the present invention, the film should preferably be formed such that the reactant gas has a partial pressure or total pressure in the range of from 0.5 Pa to 7 Pa. The pressure of the reactant gas is expressed in terms of "partial pressure or total pressure" because the reactant gas may or may not contain an assist gas. The reactant gas without assist gas is nitrogen or methane which contains elements essential for the film. The assist gas is a rare gas such as argon. In the case where the film is formed from the reactant gas without assist gas, it is necessary to control the total pressure of the reactant gas. In the case where the film is formed from the reactant gas with an assist gas, it is necessary to control the partial pressures of both the reactant gas and the assist gas. If the partial pressure or total pressure of the reactant gas is lower than 0.5 Pa, evaporation by arc gives rise to a large amount of macroparticles (resulting from molten target), making the film surface rough, which is undesirable for some applications. On the other hand, if the partial pressure or total pressure of the reactant gas is higher than 7 Pa, the reactant gas scatters evaporated particles due to frequent collision, thereby lowering the film-forming rate.

Therefore, the partial or total pressure of the reactant gas should be from 1 Pa to 5 Pa, preferably from 1.5 Pa to 4 Pa.

In the present invention, the AIP method is used for film forming, and it has been explained above. The film-forming method is not restricted to AIP; any method can be used so long as it efficiently converts the metallic elements and the reactant gas into plasma. Such additional methods include pulse sputtering and nitrogen ion beam assisted deposition.

The hard film of the present invention may be effectively produced by vapor-phase coating such as ion-plating and sputtering in which a target is vaporized or ionized so as to form a film on the substrate, as mentioned above. Any target lacking desirable properties does not permit stable discharging at the time of film forming; therefore, the resulting film is poor in the uniformity of composition. The present inventors' investigation on the target properties necessary for the hard film with good wear resistance revealed the following.

First, the target should have a relative density not lower than 95%. This condition is necessary to provide stable discharging at the time of film forming and to efficiently yield the hard film of the present invention. With a relative density lower than 95%, the target has a coarse portion such as micropores in the alloy component. A target with such an alloy component does not evaporate uniformly, and hence the resulting film varies in composition and thickness. In addition, porous portions consume locally and rapidly, thereby reducing the target life. A target with a large number of voids not only rapidly consumes but also cracks due to loss of strength. The relative density of the target should preferably be 96% or higher, more preferably 98% or higher.

Even though a target has a relative density not lower than 95%, it may not yield a good film (due to unstable discharging) if it has large voids. It is known that a target with voids larger than 0.5 mm in radius does not permit continuous film forming because arc discharging is interrupted by the alloy component evaporating or ionizing. The present inventors' investigation revealed that discharging is unstable, although not interrupted, if there are voids not smaller than 0.3 mm in radius. Therefore, for stable discharging and efficient satisfactory film forming, it is desirable that voids in a target should be smaller than 0.3 mm in radius, preferably 0.2 mm or smaller in radius.

In vapor phase coating by the AIP method, the composition of the target used determines the composition of the film formed. Therefore, it is desirable that the composition of the target should be identical with the composition of the intended film. In order to obtain the hard film of the present invention which is superior in wear resistance, it is necessary to employ a target having the composition
of $(Ti_{1-x-y-z-w}, Al_x, Cr_y, Si_z, B_w)$
$0.5 \leq x \leq 0.8$, $0.06 \leq y$, $0 \leq z \leq 0.1$, $0 \leq w \leq 0.1$,
$0 \leq z+w \leq 0.1$, $x+y+z+w<1$
(where x, y, z, and w denote respectively the atomic ratios of Al, Cr, Si, and B. This is to be repeated in the following.)
In the case where the hard film of the present invention does not contain Si and B, the values of x, y, z, and w should preferably be in the range defined below.
$0.02 \leq 1-x-y \leq 0.30$, $0.55 \leq x \leq 0.765$, $0.06 \leq y$, $z+w=0$,
or $0.02 \leq 1-x-y \leq 0.175$, $0.765 \leq x$, $4(x-0.75) \leq y$, $z+w=0$.

In addition to meeting the above-mentioned requirements for composition, the target should have a uniform distribution of composition. Otherwise, the resulting hard film lacks uniformity in the distribution of composition and hence varies in wear resistance from one part to another. In addition, a target with varied distribution of composition suffers local variation in electrical conductivity and melting point. This leads to unstable discharging and hence to a poor film. Consequently, the target of the present invention should have a uniform distribution of composition whose variation is within 0.5 atom %.

The present inventors also investigated how the discharging state at the time of film forming varies depending on the amount of inevitable impurities (such as oxygen, hydrogen, chlorine, copper, and magnesium) entering the target from the raw material or the atmosphere in which the target is produced.

As the result it was found that a target containing oxygen, hydrogen, and chlorine in large amounts explosively releases these gases, resulting in unstable discharging and, in the worst case, breaking itself, making film forming impossible. Therefore, it is desirable that the target contain oxygen, hydrogen, and chlorine in a limited amount not more than 0.3 mass %, 0.05 mass %, and 0.2 mass %, respectively. The preferred content of oxygen, hydrogen, and chlorine should be not more than 0.2 mass %, 0.02 mass %, and 0.15 mass %, respectively.

Copper and magnesium are also detrimental impurities because they are more volatile (with a higher vapor pressure) than Ti, Al, Cr, Si, and B constituting the target of the present invention. When contained in large amounts, they form voids in the target at the time of film forming, and such voids make discharging unstable during film forming. Therefore, the content of copper in a target should be 0.05 mass % or less, preferably 0.02 mass % or less. The content of magnesium in a target should be 0.03 mass % or less, preferably 0.02 mass % or less.

One way to reduce the content of impurities as specified above is by vacuum melting of raw material powder or by mixing of raw material powder in a clean atmosphere.

In the meantime, the present invention does not specify the method of preparing the target. However, there is a preferred method which consists of uniformly mixing raw material powers in an adequate ratio by using a V-blender or the like and then subjecting the resulting mixture to CIP (cold isostatic pressing) or HIP (hot isostatic pressing). The raw material powder is composed of Ti powder, Cr powder, Al powder, Si powder, and B powder which have an adequately controlled particle size. Other methods include hot extrusion and super-high pressure hot pressing.

Although it is possible to produce a target from the mixed powder by hot pressing (HP), the resulting target does not have a sufficiently high relative density because Cr is a high-melting metal. Instead of producing a target from a mixed powder as mentioned above, it is also possible to produce a target from a previously alloyed powder, by means of CIP or HIP, or through melting and solidifying. The CIP or HIP with an alloy powder offers the advantage that the resulting target has a uniform composition; however, it also suffers the disadvantage that the resulting target tends to have a low relative density because the alloy powder is poor in sinterability. The method involving the melting and solidifying of an alloyed powder offers the advantage that the resulting target has a comparatively uniform composition but has the disadvantage that the resulting target is subject to cracking and shrinkage cavity at the time of solidification. It does not easily yield the target of the present invention.

EXAMPLES

The invention will be described in more detail with reference to the following examples, which are not intended to restrict the scope thereof. Various changes and modifications may be made to the examples without departing from the spirit and scope of the invention.

Example 1

A target of alloy composed of Ti, Cr, and Al was mounted on the cathode of the AIP apparatus shown in FIG. 2. A substrate was mounted on the holder. The substrate is a chip of cemented carbide, a square end mill of cemented carbide (10 mm in diameter, with two edges), or a piece of platinum foil (0.1 mm thick). The chamber was evacuated to a degree of vacuum lower than $3 \times 10^{-3}$ Pa while the substrate was being heated to 400° C. by means of a heater placed in the chamber. The substrate was given a bias voltage of 700V in an argon atmosphere at 0.66 Pa, so that the substrate was cleaned with argon ions for 10 minutes. Subsequently, nitrogen gas was introduced into the chamber. With the chamber pressure kept at 2.66 Pa, an arc current of 100 A was applied for film forming. A 4-$\mu$m thick film was formed on the surface of the substrate. Incidentally, a bias voltage of 150V was applied to the substrate so that the substrate was kept negative with respect to earth potential during film forming.

After the film-forming step was complete, the resulting film was examined for composition of metal components, crystal structure, Vickers hardness, and oxidation starting. temperature. Vickers hardness was measured by using a microvickers tester under a load of 0.25N for 15 seconds. The composition of Ti, Cr, and Al in the film was determined by EPMA. The content of metal elements and impurity-elements (such as O and C, excluding N) in the film was also determined by EPMA. It was found that the content of oxygen is less than 1 atom % and the content of carbon is less than 2 atom %. The crystal structure of the film was identified by X-ray diffraction. The oxidation starting temperature was measured as follows by using the platinum sample. The platinum sample was heated in a dry air from room temperature at a rate of 5° C./min by using a thermobalance. The temperature at which the weight changes is measured and it is regarded as the oxidation starting temperature. The value in the foregoing expression (4) was obtained by measuring the intensity of peaks due to respective crystal planes by using an X-ray diffractometer with Cu K$\alpha$ line. Table 1 shows the thus obtained results (including composition of film, crystal structure, Vickers hardness, oxidation starting temperature, and the value of expression (4)).

TABLE 1

| Experiment No. | Metals in film (atomic ratio) | | | Vickers hardness | Oxidation starting temperature (° C.) | Crystal structure* | Value of expression (4) |
|---|---|---|---|---|---|---|---|
| | Ti | Cr | Al | | | | |
| 1 | 0.27 | 0.07 | 0.66 | 3090 | 850 | B1 | 1 |
| 2 | 0.21 | 0.08 | 0.71 | 3010 | 880 | B1 + Hex | 0.83 |
| 3 | 0.19 | 0.07 | 0.74 | 2960 | 900 | B1 + Hex | 0.81 |
| 4 | 0.09 | 0.15 | 0.76 | 2950 | 920 | B1 + Hex | 0.86 |
| 5 | 0.02 | 0.19 | 0.79 | 2900 | 960 | B1 + Hex | 0.82 |
| 6 | 0.18 | 0.12 | 0.70 | 3300 | 880 | B1 | 1 |
| 7 | 0.09 | 0.19 | 0.72 | 3500 | 910 | B1 | 1 |
| 8 | 0.04 | 0.21 | 0.75 | 3300 | 940 | B1 | 1 |
| 9 | 0.28 | 0.12 | 0.60 | 3080 | 850 | B1 | 1 |
| 10 | 0.18 | 0.20 | 0.62 | 3200 | 870 | B1 | 1 |
| 11 | 0.11 | 0.22 | 0.67 | 3340 | 890 | B1 | 1 |
| 12 | 0.10 | 0.28 | 0.62 | 3130 | 870 | B1 | 1 |
| 13 | 0.04 | 0.28 | 0.68 | 3210 | 910 | B1 | 1 |
| 14 | 0.04 | 0.33 | 0.63 | 3110 | 880 | B1 | 1 |
| 15 | 0.17 | 0.25 | 0.58 | 3050 | 860 | B1 | 1 |
| 16 | 0.10 | 0.34 | 0.56 | 3020 | 860 | B1 | 1 |
| 17 | 0.04 | 0.38 | 0.58 | 3030 | 870 | B1 | 1 |
| 18 | 0.32 | 0.10 | 0.58 | 2870 | 830 | B1 | 1 |
| 19 | 0.22 | 0.26 | 0.52 | 2920 | 830 | B1 | 1 |
| 20 | 0.04 | 0.43 | 0.53 | 2820 | 840 | B1 | 1 |
| 21 | 0.44 | 0 | 0.56 | 2700 | 800 | B1 | 1 |
| 22 | 0.40 | 0 | 0.60 | 3050 | 820 | B1 | 1 |
| 23 | 0.25 | 0 | 0.75 | 2700 | 850 | B1 | 1 |
| 24 | 0.17 | 0.05 | 0.78 | 2300 | 900 | B1 + Hex | 0.55 |
| 25 | 0.10 | 0.10 | 0.80 | 2200 | 930 | B1 + Hex | 0.35 |
| 26 | 0.03 | 0.17 | 0.80 | 2500 | 960 | B1 + Hex | 0.75 |
| 27 | 0 | 0.25 | 0.75 | 2650 | 950 | B1 | 1 |

*B1 represents sodium chloride structure, and Hex represents ZnS structure.

It is noted from Table 1 that the samples of TiAlN ($0.56 \leq Al \leq 0.75$) in Experiment Nos. 21, 22, and 23 have a film hardness of 2700–3050 and an oxidation stating temperature of 800–850° C. However, they do not have both improved film hardness and oxidation starting temperature. By contrast, the samples of Experiment Nos. 1 to 17, which have the composition as specified in the present invention, have a high Vickers hardness as well as a high oxidation starting temperature.

The composition for metal components Ti, Al, and Cr in the (Ti,Al,Cr)N film is shown in FIG. 8. Each composition is indicated by the sample No. (1 to 27). Samples Nos. 1 to 17 (marked with ●, ▲, and ■), which are within the range specified by the present invention, has both the high hardness and the high oxidation starting temperature characteristic of TiAlN ($0.56 \leq Al \leq 0.75$). In particular, samples Nos. 3 to 5 (marked with ■), which have a composition within the desirable range, have a high oxidation starting temperature, which is almost comparable to that of TiAlN (0.56≦Al≦0.75) and also has a very high hardness. Samples Nos. 15 to 17 have a hardness equivalent to the highest hardness of TiAlN (0.56≦Al≦0.75) and also a high oxidation starting temperature.

Samples Nos. 6 to 9 and 10 to 14 (marked with ●), which have a composition within the desirable range, has the highest hardness and the highest oxidation starting temperature which have never been attained by the conventional TiAlN (0.56≦Al≦0.75) film. They exhibit better wear resistance than the conventional TiAlN (0.56≦Al≦0.75) film.

By contrast, samples Nos. 18 to 20 and 24 to 27 (marked with ○), which have a composition outside the range specified in the present invention, do not have a high hardness and a high oxidation starting temperature at the same time. They are equivalent to or inferior to the conventional TiAlN (0.56≦Al≦0.75) film and hence they are not expected to have better wear resistance than the conventional TiAlN (0.56≦Al≦0.75) film.

Example 2

Samples Nos. 1, 4, 7, 11, 16, 18, 19, 22, 24, and 27 in Example 1, which are end mills coated with the hard film, were tested for wear resistance by cutting several works of quenched JIS-SKD61 (HRC50) under the following conditions.

Cutting speed: 200 m/min

Feed speed: 0.07 mm/edge

Depth of cut: 5 mm

Pick feed: 1 mm

Cutting oil: air blow only

Cutting direction: down cutting

After cutting over a length of 20 meters, the cutting edge of the end mill was examined under an optical microscope to measure the worn width. The results are shown in Table 2.

TABLE 2

| Experiment No. | Worn width ($\mu$m) |
|---|---|
| 1 | 38 |
| 4 | 32 |
| 7 | 24 |
| 11 | 26 |
| 16 | 33 |
| 18 | 59 |
| 19 | 55 |
| 22 | 48 |

TABLE 2-continued

| Experiment No. | Worn width ($\mu$m) |
|---|---|
| 24 | 73 |
| 27 | 52 |

It is noted from Table 2 that the samples of end mills Nos. 1, 4, 7, 11 and 16, which are coated with the film meeting the requirements of the present invention, are superior in wear resistance (in terms of worn width) to the samples Nos. 18, 19, 22, 24, and 27, which are coated with the film not meeting the requirements of the present invention.

Example 3

A target of alloy composed of Ti, Cr, Al, and Si was mounted on the cathode of the AIP apparatus shown in FIG. 2. A substrate was mounted on the holder. The substrate is a chip of cemented carbide, a square end mill of cemented carbide (10 mm in diameter, with four edges), or a piece of platinum foil (0.2 mm thick). The chamber was evacuated to a degree of vacuum lower than $3 \times 10^{-3}$ Pa while the substrate was being heated to 550° C. by means of a heater place in the chamber. The substrate was cleaned with argon ions for 10 minutes. Subsequently, nitrogen gas or a mixture gas of nitrogen and methane was introduced into the chamber. With the chamber pressure kept at 2.66 Pa, an arc current of 100 A was applied for film forming. An approximately 3-$\mu$m thick film was formed on the surface of the substrate. Incidentally, a bias voltage of 100–200V was applied to the substrate so that the substrate was kept negative with respect to earth potential during film forming.

After the film-forming step was complete, the resulting film was examined for composition of metal components, crystal structure, Vickers hardness, and oxidation starting temperature. The composition of Ti, Cr, Al, and Si in the film was determined by EPMA (with mass absorption coefficient corrected). The content of metal elements and impurity elements (such as O and C, excluding N) in the film was also determined by EPMA. It was found that the content of oxygen is less than 1 atom % and the content of carbon is less than 2 atom % (in the case where methane was not used as the film-forming gas). The resulting film was examined for crystal structure, Vickers hardness (under a load of 0.25N), and oxidation starting temperature in the same way as in Example 1. Table 3 shows the thus obtained results (including composition of film, crystal structure, Vickers hardness, oxidation starting temperature, and the value of expression (4)).

TABLE 3

| Experiment No. | Composition (atomic ratio) | | | | | | Vickers hardness | Oxidation strating temperature (° C.) | Crystal structure* | Value of expression (4) |
|---|---|---|---|---|---|---|---|---|---|---|
| | Ti | Cr | Al | Si | C | N | | | | |
| 1 | 0.73 | 0 | 0.25 | 0.02 | 0.00 | 1.00 | 2500 | 700 | B1 | 1 |
| 2 | 0.37 | 0.20 | 0.40 | 0.03 | 0.00 | 1.00 | 2600 | 750 | B1 | 1 |
| 3 | 0.02 | 0.10 | 0.85 | 0.03 | 0.00 | 1.00 | 2000 | 1100 | B1 + Hex | 0.1 |
| 4 | 0.05 | 0.10 | 0.70 | 0.15 | 0.00 | 1.00 | 2200 | 1050 | B1 + Hex | 0.1 |
| 5 | 0.10 | 0.18 | 0.72 | 0.00 | 0.00 | 1.00 | 2900 | 950 | B1 | 1 |
| 6 | 0.12 | 0.15 | 0.70 | 0.03 | 0.60 | 0.40 | 3000 | 750 | B1 | 1 |
| 7 | 0.30 | 0.18 | 0.50 | 0.02 | 0.00 | 1.00 | 2950 | 950 | B1 | 1 |
| 8 | 0.11 | 0.15 | 0.71 | 0.03 | 0.00 | 1.00 | 3300 | 1150 | B1 | 1 |
| 9 | 0.04 | 0.20 | 0.70 | 0.06 | 0.00 | 1.00 | 3050 | 1100 | B1 | 1 |
| 10 | 0.13 | 0.15 | 0.70 | 0.02 | 0.00 | 1.00 | 3200 | 1150 | B1 | 1 |
| 11 | 0.18 | 0.08 | 0.71 | 0.03 | 0.00 | 1.00 | 3100 | 1100 | B1 | 1 |

TABLE 3-continued

| Experiment No. | Composition (atomic ratio) | | | | | | Vickers hardness | Oxidation strating temperature (° C.) | Crystal structure* | Value of expression (4) |
| --- | --- | --- | --- | --- | --- | --- | --- | --- | --- | --- |
| | Ti | Cr | Al | Si | C | N | | | | |
| 12 | 0.18 | 0.08 | 0.71 | 0.03 | 0.20 | 0.80 | 3100 | 1050 | B1 | 1 |
| 13 | 0.18 | 0.08 | 0.71 | 0.03 | 0.40 | 0.60 | 3020 | 1020 | B1 | 1 |
| 14 | 0.08 | 0.25 | 0.65 | 0.02 | 0.00 | 1.00 | 3050 | 1050 | B1 | 1 |
| 15 | 0.07 | 0.30 | 0.60 | 0.03 | 0.00 | 1.00 | 3000 | 1000 | B1 | 1 |
| 16 | 0.20 | 0.13 | 0.65 | 0.02 | 0.00 | 1.00 | 3030 | 980 | B1 | 1 |
| 17 | 0.25 | 0.12 | 0.60 | 0.03 | 0.00 | 1.00 | 3000 | 970 | B1 | 1 |

*B1 represents sodium chloride structure, and Hex represents ZnS structure.

It is noted from Table 3 that the sample of TiAlSiN ($0.05 \leq Al \leq 0.75$) in Experiment No. 1 has neither improved hardness nor improved oxidation stating temperature. It is also noted that the samples Nos. 2, 3, 4, and 6, which do not meet the requirements of the present invention, are poor in either film hardness or oxidation starting temperature. By contrast, the samples of Experiment Nos. 5 and 7 to 17, which have the composition as specified in the present invention, have a high Vickers hardness as well as a high oxidation starting temperature.

Example 4

Samples Nos. 3, 5, 8, 10, 12, 15, and 16, in Example 3, which are end mills coated with the hard film, were tested for wear resistance by cutting several works of quenched JIS-SKD61 (HRC50) under the following conditions.

Cutting speed: 200 m/min
Feed speed: 0.05 mm/edge
Depth of cut: 5 mm
Pick feed: 1 mm
Cutting oil: air blow only
Cutting direction: down cutting After cutting over a length of 30 meters, the cutting edge of the end mill was examined under an optical microscope to measure the worn width. The results are shown in Table 4.

TABLE 4

| Experiment No. | Worn width ($\mu$m) |
| --- | --- |
| 3 | 35 |
| 5 | 25 |
| 8 | 15 |
| 10 | 13 |
| 12 | 17 |
| 15 | 20 |
| 16 | 19 |

It is noted from Table 4 that the samples of end mills Nos. 5, 8, 10, 12, 15 and 16, which are coated with the film meeting the requirements of the present invention, are superior in wear resistance (in terms of worn width) to the sample No. 3, which is coated with the film not meeting the requirements of the present invention.

Example 5

Using a target of alloy composed of Ti (9 at %), Cr (19 at %), and Al (72 at %), a square end mill of cemented carbide (10 mm in diameter, with two edges) was coated with a film of TiCrAlN (varying in thickness as shown in Table 5) in the same way as in Example 1, except that the length of film-forming time was changed. The vaporizing source shown in FIG. 4 was used. The metal components of the film were analyzed by EPMA. The composition was found to be Ti: 10 at % Cr: 20 at %, and Al: 70 at %. The coated end mill was examined for wear resistance by cutting test in the same way as in Example 2. The results are shown in Table 5.

TABLE 5

| Experiment No. | Film thickness ($\mu$m) | Worn width ($\mu$m) |
| --- | --- | --- |
| 1 | 0.9 | 30 |
| 2 | 2 | 24 |
| 3 | 4 | 25 |
| 4 | 10 | 20 |
| 5 | 18 | 20 |
| 6 | 0.3 | 55 |
| 7 | 21 | Note |

Note:
The edge broke after cutting over a length of 15 meters.

It is noted from Table 5 that the samples Nos. 1 to 5, which have an adequate film thickness as specified in the present invention, exhibit good wear resistance (in terms of worn width). The sample No. 6, which has a small film thickness, is poor in wear resistance. The Sample No. 7, which as an excessive film thickness, broke during cutting.

Example 6

Film coating was performed on a substrate (a chip of cemented carbide, a square end mill of cemented carbide (10 mm in diameter, with two edges), or a piece of platinum foil 0.1 mm thick)) which is placed on the holder in the AIP apparatus shown in FIG. 2, by using a target of alloy composed of Ti (13 at %), Cr (15 at %), and Al (72 at %). With the vacuum chamber evacuated, the substrate was heated to 550° C. by means of a heater placed in the chamber. A mixture gas of nitrogen and methane was introduced into the chamber so that the pressure in the chamber was kept at 2.66 Pa. An arc current of 100 A was applied for film forming On the substrate was formed a (TiAlCr)(CN) film (3 $\mu$m thick). During film forming, a bias voltage of 150V was applied to the substrate so as to keep it negative with respect to earth potential. Other film-forming conditions are the same as those in Example 1. After the film-forming step was complete, the resulting film was examined for composition of metal components, oxidation starting temperature, and wear resistance. The composition of Ti, Al, and Cr in the film was determined by EPMA. The content of metal elements and impurity elements (excluding C and N) in the film was also determined by EPMA. It was found that the content of oxygen is less than 1 atom %. The oxidation starting temperature was measured in the same way as in Example 1. The coated end mill was examined forwear resistance by cutting test in the same way as in Example 2. The results are shown in Table 6.

TABLE 6

| Experiment No. | Film composition (atomic ratio) | | | | | Worn width ($\mu$m) | Oxidation starting temperature (° C.) |
| --- | --- | --- | --- | --- | --- | --- | --- |
| | Ti | Al | Cr | C | N | | |
| 1 | 0.14 | 0.69 | 0.17 | 0.1 | 0.9 | 23.0 | 950 |
| 2 | 0.14 | 0.69 | 0.17 | 0.3 | 0.7 | 25.0 | 930 |
| 3 | 0.14 | 0.69 | 0.17 | 0.4 | 0.6 | 28.0 | 920 |
| 4 | 0.14 | 0.69 | 0.17 | 0.6 | 0.4 | 45.0 | 800 |

Target: TiAlCr (Ti:Al:Cr = 13:72:15)

It is noted from Table 6 that the end mill samples Nos. 1 to 3, which are coated with a film meeting the requirements of the present invention, have a higher oxidation starting temperature and better wear resistance (in terms of worn width) in cutting test than the end mill sample No. 4, which is coated with a (TiAlCr)(CN) film containing C and N in a ratio outside the range specified in the present invention.

Example 7

Film coating (approximately 3.5 Am thick) was performed on substrates by using the AIP apparatus shown in FIG. 2. The substrates, the composition of film, and the composition of alloy targets are shown below.

Substrates:

Chips of cemented carbide (for measurement of composition) Throw-away inserts of cemented carbide (type: CNMG120408, CNMG432, with chip breaker)

Composition of Film:

TiCrAlN

TiCrAlSiN

TiAlN

Composition of Alloy Targets:

Ti: 10 at %, Cr: 18 at %, Al: 72 at %

Ti: 12 at %, Cr: 15 at %, Al: 70 at %, Si: 3 at %

Ti: 50 at %, Al: 50 at %

The bias voltage applied to the substrate was 200 V for TiCrAlN film and TiCrAlSiN film and 50V for TiAlN film. The film-forming conditions were the same as those in Example 1, except that the substrate temperature was 550° C., the arc current was 150 A, and the pressure of the reactant gas (nitrogen gas) was 2.66 Pa.

After the film-forming step was complete, the resulting film was examined for wear resistance and composition as follows. Wear resistance was measured by actual turning with the throw-away insert of cemented carbide under the following conditions. Wear resistance is rated in terms of flank wear (Vb, $Vb_{max}$). The results are shown in Table 7.

Cutting Conditions:

Work: S45C (raw)

Cutting speed: 200 m/min

Feed speed: 0.2 mm/turn

Depth of cut: 1.5 mm

Others: dry cutting, continuous turning

Cut length: 12000 meters after 60 minutes

The resulting film was found by analysis with EPMA to have the composition of $(Ti_{0.1}Cr_{0.22}Al_{0.68})N$, $(Ti_{0.14}Cr_{0.15}Al_{0.68}Si_{0.03})N$, and $(Ti_{0.54}Al_{0.46})N$. It was also found that the resulting film contains a little less Al than the target used. The atomic ratio of metal elements and nitrogen atoms in the films was in the range of from 0.9 to 1.1.

TABLE 7

| Experiment No. | Type of film | Flank wear (Vb: $\mu$m) | Flank wear ($Vb_{max}$: $\mu$m) |
| --- | --- | --- | --- |
| 1 | TiAlN | 39.6 | 158 |
| 2 | TiCrAlN | 35.9 | 44 |
| 3 | TiCrAlSiN | 34.3 | 42 |

It is noted from Table 7 that the coating film meeting the requirements of the present invention is superior in wear resistance as demonstrated by the small flank wear Vb and $Vb_{max}$ (which is about one-fourth that of the comparative sample).

Example 8

Film coating was performed on a substrate, namely, a chip of cemented carbide or a square end mill of cemented carbide (10 mm in diameter, with four edges), which is placed on the holder in the AIP apparatus shown in FIG. 2, by using a target of alloy variously composed of Ti, Cr, Al, and B. With the vacuum chamber evacuated to 2.66 Pa, an arc current of 150A was applied for film forming, so that the surface of the substrate was coated with an approximately 3-$\mu$m thick (TiAlCrB)N film having the composition shown in Table 8. Incidentally, during film forming, a bias voltage of 150V was applied to the substrate so as to keep it negative with respect to earth potential. Other film-forming conditions are the same as those in Example 3. The resulting film was examined for the compositional ratio of Ti, Al, Cr, and B by EPMA. The content of metal elements and impurity elements such as 0 (excluding N) in the film was also determined by EPMA. It was found that the content of oxygen is less than 1 atom %. The results are shown in Table 8.

TABLE 8

| Experiment No. | Film composition (atomic ratio) | | | | | Worn width ($\mu$m) | Oxidation starting temperature (° C.) |
| --- | --- | --- | --- | --- | --- | --- | --- |
| | Ti | Al | Cr | B | N | | |
| 1 | 0.13 | 0.68 | 0.16 | 0.03 | 1 | 23 | 1050 |
| 2 | 0.11 | 0.70 | 0.16 | 0.03 | 1 | 25 | 1050 |
| 3 | 0.11 | 0.67 | 0.16 | 0.06 | 1 | 28 | 1030 |
| 4 | 0.15 | 0.645 | 0.20 | 0.005 | 1 | 33 | 950 |

It is noted from Table 8 that the samples Nos. 1 to 3, which are coated with a film containing B in an amount specified in the present invention, have a higher oxidation starting temperature and better wear resistance (in terms of worn width) in cutting test as compared with the sample No. 4. It is apparent that a hard film with good wear resistance is obtained if it contains B in an amount specified in the present invention.

Example 9

Film coating was performed on a square end mill of cemented carbide (10 mm in diameter, with two edges) as a substrate by using a target of alloy composed of Ti (9 at %), Cr (19 at %), and Al (72 at %) in the same way as in Example 1. Several (Ti,Al,Cr)N films varying in crystal orientation were formed at varied bias voltage and film-forming temperature. Also, several (Ti,Al,Cr)(CN) films varying in the ratio of C and N were formed by using a mixture gas of nitrogen and methane as the film-forming gas. Further, several layered films composed of (Ti,Al,Cr)N film and $Ti_{50}Al_{50}N$ film were formed. The sample No. 8 in Table 9 is a layered film composed of (Ti,Al,Cr)(CN) film and $Ti_{50}Al_{50}N$ film, which were sequentially formed on the surface of the end mill of cemented carbide. The sample No. 9 in Table 9 is a layered film composed of ten (Ti,Al,Cr)(CN) films and ten $Ti_{50}Al_{50}N$ films, which were alternately formed on the surface of the end mill of cemented carbide. The layered film had a total thickness of about 3 $\mu$m. The resulting samples were examined for wear resistance by cutting in the same way as in Example 2. Wear resistance was rated in terms of worn width. The results are shown in Table 9.

TABLE 9

| Experiment No. | Atomic ratio of C and N in (Ti, Cr, Al)(CN) film C | Atomic ratio of C and N in (Ti, Cr, Al)(CN) film N | Film other than (Ti, Cr, Al)(CN) film | Total layers | I(111)/I(220) | I(200)/I(220) | Worn width ($\mu$m) |
|---|---|---|---|---|---|---|---|
| 1 | 0 | 1 | None | 1 | 7.7 | 4 | 26 |
| 2 | 0 | 1 | None | 1 | 0.8 | 3 | 25 |
| 3 | 0 | 1 | None | 1 | 0.8 | 0.8 | 45 |
| 4 | 0.1 | 0.9 | None | 1 | — | — | 28 |
| 5 | 0.25 | 0.75 | None | 1 | — | — | 31 |
| 6 | 0.55 | 0.45 | None | 1 | — | — | 45 |
| 7 | 0.7 | 0.3 | None | 1 | — | — | 57 |
| 8 | 0 | 1 | $Ti_{0.5}Al_{0.5}N$ | 2 | — | — | 28 |
| 9 | 0 | 1 | $Ti_{0.5}Al_{0.5}N$ | 20 | — | — | 27 |

It is noted from Table 9 that samples Nos. 3, 6, and 7 are superior in wear resistance as indicated by the large worn width. This suggests that the coating film has good wear resistance if the crystal orientation and the C/N ratio in the (Ti,Al,Cr)(CN) film are so controlled as to meet the requirements of the present invention.

Example 10

Film coating was performed on a square end mill of cemented carbide (10 mm in diameter, with two edges) or a chip of cemented carbide by using a target of alloy composed of Ti (10 at %), Cr (18 at %), and Al (72 at %). An approximately 3-$\mu$m thick (Ti,Al,Cr)N film was formed on the substrate by using the AIP apparatus shown in FIG. 2, with the bias voltage, substrate temperature, and nitrogen gas pressure varied as shown in Tables 10 and 11. The arc current at the time of film forming was 150A, and other conditions were the same as those in Example 1.

After the film-forming step was complete, the coating film was examined for metal composition, crystal structure, crystal orientation, X-ray diffraction, Vickers hardness, and wear resistance. (The data of X-ray diffraction include the angle of diffraction and the half width of peaks due to the (111) plane of sodium chloride structure.) X-ray diffractometry was carried out by $\theta$–$2\theta$ method with Cu K$\alpha$ line. Wear resistance was measured (in terms of worn width) by cutting test in the same way as in Example 2. The composition of metal components in the coating film was analyzed by EPMA. It was found as shown in Table 11 that the composition slightly fluctuates as follows depending on the film-forming conditions.

Ti: 10–12 at %, Cr: 20–23 at %, and Al: 66–68 at %

The results of this example are summarized in Tables 10 and 11. Quantitative analyses by EPMA for metal elements and impurity elements in the coating film show that the amount of oxygen and carbon is less than 1 atom % and less than 2 atom %, respectively, and the atomic ratio of total metal elements to nitrogen was from 0.9 to 1.1.

TABLE 10

| Experiment No. | Bias voltage (V) | Substrate temperature (° C.) | Nitrogen gas pressure (Pa) | Value of expression (4) | I(200)/I(111) | I(111)/I(220) | I(200)/I(220) | Angle of diffraction (°)* | Half width | Hardness | Worn width |
|---|---|---|---|---|---|---|---|---|---|---|---|
| 1 | 50 | 550 | 2.66 | 0.87 | 1.4 | 2.4 | 3.4 | 37.66 | 0.72 | 3050 | 29.8 |
| 2 | 75 | 550 | 2.66 | 1 | 1.0 | 3.0 | 2.9 | 37.51 | 0.62 | 3200 | 23.5 |
| 3 | 100 | 550 | 2.66 | 1 | 0.2 | 9.5 | 2.1 | 37.48 | 0.52 | 3300 | 20.1 |
| 4 | 150 | 550 | 2.66 | 1 | 1.2 | 9.6 | 11.8 | 37.57 | 0.45 | 3350 | 18.7 |
| 5 | 200 | 550 | 2.66 | 1 | 5.6 | 2.2 | 12.4 | 37.51 | 0.60 | 3200 | 23.5 |
| 6 | 250 | 550 | 2.66 | 1 | 6.5 | 2.0 | 13.3 | 37.53 | 0.51 | 3150 | 25.4 |
| 7 | 400 | 550 | 2.66 | Excessively thin film | — | — | — | — | — | Excessively thin film | Excessively thin film |
| 8 | 150 | 550 | 0.30 | 1 | 2.1 | 7.5 | 16.0 | 37.55 | 0.55 | 2900 | 38.4 |
| 9 | 150 | 550 | 1.33 | 1 | 1.8 | 8.8 | 15.9 | 37.57 | 0.50 | 3200 | 23.5 |
| 10 | 150 | 550 | 2.66 | 1 | 1.2 | 9.6 | 11.8 | 37.57 | 0.45 | 3350 | 18.7 |
| 11 | 150 | 550 | 3.99 | 1 | 0.8 | 9.5 | 7.3 | 37.55 | 0.47 | 3300 | 20.1 |
| 12 | 150 | 550 | 5.2 | 1 | 1.1 | 6.3 | 6.8 | 37.59 | 0.45 | 3250 | 21.7 |
| 13 | 150 | 550 | 7.8 | Excessively thin film | — | — | — | — | — | Excessively thin film | Excessively thin film |
| 14 | 150 | 250 | 2.66 | Film peeled | — | — | — | — | — | Film peeled | Film peeled |

TABLE 10-continued

| Experiment No. | Bias voltage (V) | Substrate temperature (° C.) | Nitrogen gas pressure (Pa) | Value of expression (4) | I(200)/ I(111) | I(111)/ I(220) | I(200)/ I(220) | Angle of diffraction (°)* | Half width | Hardness | Worn width |
|---|---|---|---|---|---|---|---|---|---|---|---|
| 15 | 150 | 450 | 2.66 | 1 | 2.1 | 6.7 | 13.7 | 37.58 |  | 3200 | 23.5 |
| 16 | 150 | 550 | 2.66 | 1 | 1.2 | 9.6 | 11.8 | 37.57 | 0.45 | 3300 | 20.1 |
| 17 | 150 | 650 | 2.66 | 0.96 | 0.7 | 11.8 | 7.7 | 37.41 | 0.71 | 3300 | 20.1 |
| 18 | 150 | 850 | 2.66 | 0.9 | 0.5 | 12.8 | 6.8 | 37.30 |  | 2950 | 35.3 |

Target: TiAlCr (Ti:Al:Cr = 10:72:18),
*angle of diffraction due to (111) plane.

TABLE 11

| Experiment No. | Bias voltage (V) | Substrate temperature (° C.) | Nitrogen gas pressure (Pa) | Composition of film (atomic ratio) | | |
|---|---|---|---|---|---|---|
|  |  |  |  | Ti | Cr | Al |
| 1 | 50 | 550 | 2.66 | 0.10 | 0.21 | 0.69 |
| 2 | 75 | 550 | 2.66 | 0.11 | 0.22 | 0.67 |
| 3 | 100 | 550 | 2.66 | 0.11 | 0.22 | 0.67 |
| 4 | 150 | 550 | 2.66 | 0.11 | 0.22 | 0.66 |
| 5 | 200 | 550 | 2.66 | 0.12 | 0.22 | 0.66 |
| 6 | 250 | 550 | 2.66 | 0.12 | 0.22 | 0.66 |
| 7 | 400 | 550 | 2.66 | Excessively thin film | | |
| 8 | 150 | 550 | 0.3 | 0.12 | 0.22 | 0.66 |
| 9 | 150 | 550 | 1.33 | 0.12 | 0.22 | 0.66 |
| 10 | 150 | 550 | 2.66 | 0.11 | 0.22 | 0.66 |
| 11 | 150 | 550 | 3.99 | 0.11 | 0.22 | 0.66 |
| 12 | 150 | 550 | 5.2 | 0.11 | 0.22 | 0.66 |
| 13 | 150 | 550 | 7.8 | Excessively thin film | | |
| 14 | 150 | 250 | 2.66 | Film peeled | | |
| 15 | 150 | 450 | 2.66 | 0.11 | 0.22 | 0.67 |
| 16 | 150 | 550 | 2.66 | 0.11 | 0.22 | 0.66 |
| 17 | 150 | 650 | 2.66 | 0.10 | 0.21 | 0.69 |
| 18 | 150 | 850 | 2.66 | 0.10 | 0.20 | 0.70 |

It is noted from Tables 10 and 11 that the samples Nos. 1 to 6, 9 to 12, and 15 to 17, which were prepared at an adequately controlled bias voltage, reactant gas pressure, and substrate temperature according to the present invention, are superior in hardness and wear resistance (in terms of worn width) to the samples Nos. 7, 8, 13, 14, and 18. This suggests that the coating film has the crystal orientation, the angle of diffraction, and the half width as desired if the film forming conditions are controlled as specified in the present invention. Thus the resulting film has outstanding wear resistance.

Example 11

Film coating was performed on a square end mill of cemented carbide (10 mm in diameter, with four edges), a chip of cemented carbide, and a piece of platinum foil (0.1 mm thick) by using a target of alloy composed of Ti (12 at %), Cr (15 at %), Al (70 at %), and Si (3 at %). An approximately 3-μm thick (Ti,Cr,Al,Si)N film was formed on the substrate by using the AIP apparatus shown in FIG. 2, with the bias voltage, substrate temperature, and nitrogen gas pressure varied as shown in Tables 12 and 13. The arc current at the time of film forming was 150 A, and other conditions were the same as those in Example 3.

After the film-forming step was complete, the coating film was examined for metal composition, crystal structure, crystal orientation, X-ray diffraction, Vickers hardness, and wear resistance. (The data of X-ray diffraction include the angle of diffraction and the half width of peaks due to the (111) plane of sodium chloride structure.) X-ray diffractometery was carried out by θ–2θ method with Cu Kα line. Wear resistance was measured (in terms of worn width) by cutting test in the same way as in Example 4. The composition of metal components in the coating film was analyzed by EPMA. It was found that the oxidation starting temperature of the film formed on the platinum foil was higher than 1100° C.

TABLE 12

| Experiment No. | Bias voltage (V) | Substrate temperature (° C.) | Nitrogen gas pressure (Pa) | Crystal structure | Value of expression (4) | I(200)/ I(111) | I(111)/ I(220) | I(200)/ I(220) | Angle of diffraction (°)* | Hardness | Worn width |
|---|---|---|---|---|---|---|---|---|---|---|---|
| 1 | 50 | 550 | 2.66 | B + H | 0.53 | — | — | — | — | 2934 | 29.0 |
| 2 | 75 | 585 | 2.66 | B + H | 0.6 | — | — | — | — | 3127 | 21.1 |
| 3 | 100 | 577 | 2.66 | B | 1 | 0.42 | 1.24 | 0.52 | 37.07 | 3127 | 21.1 |
| 4 | 125 | 600 | 2.66 | B | 1 | 0.47 | 2.65 | 1.25 | 36.98 | 3210 | 18.5 |
| 5 | 150 | 594 | 2.66 | B | 1 | 1.83 | 2.01 | 3.68 | 37.06 | 3296 | 16.2 |
| 6 | 200 | 612 | 2.66 | B + H | 0.8 | 3.17 | 1.69 | 5.35 | 37.03 | 3127 | 21.1 |
| 7 | 250 | 624 | 2.66 | B + H | 0.7 | 3.73 | 1.72 | 6.40 | 37.01 | 3210 | 18.5 |
| 8 | 350 | 650 | 2.66 | B + H | 0.75 | 7.82 | 0.80 | 6.22 | 37.04 | 3210 | 18.5 |
| 9 | 450 | 680 | 2.66 | Excessively thin film | Excessively thin film | — | — | — | — | Excessively thin film | Excessively thin film |
| 10 | 150 | 580 | 0.30 | B + H | 0.45 | 3.25 | 5.77 | 18.75 | 36.92 | 2950 | 28.2 |
| 11 | 150 | 580 | 1.33 | B | 1 | 2.12 | 5.38 | 11.36 | 37.01 | 3296 | 16.2 |
| 12 | 150 | 580 | 3.99 | B | 1 | 1.44 | 2.38 | 3.43 | 37.06 | 3296 | 16.2 |
| 13 | 150 | 580 | 7.80 | Excessively thin film | Excessively thin film | — | — | — | — | Excessively thin film | Excessively thin film |
| 14 | 150 | 250 | 2.66 | Film peeled | Film peeled | — | — | — | — | Flim peeled | Film peeled |

TABLE 12-continued

| Experiment No. | Bias voltage (V) | Substrate temperature (° C.) | Nitrogen gas pressure (Pa) | Crystal structure | Value of expression (4) | I(200)/ I(111) | I(111)/ I(220) | I(200)/ I(220) | Angle of diffraction (°)* | Hardness | Worn width |
|---|---|---|---|---|---|---|---|---|---|---|---|
| 15 | 150 | 480 | 2.66 | B | 1 | 1.90 | 1.51 | 2.86 | 37.09 | 3210 | 18.5 |
| 16 | 150 | 520 | 2.66 | B | 1 | 0.85 | 3.02 | 2.56 | 37.06 | 3230 | 17.9 |
| 17 | 150 | 660 | 2.66 | B + H | 0.8 | 0.68 | 3.16 | 2.14 | 37.06 | 3250 | 17.4 |
| 18 | 150 | 850 | 2.66 | B + H | 0.4 | 0.64 | 3.45 | 2.21 | 37.02 | 2950 | 28.2 |

Target: TiCrAlSi (Ti:Cr:Al:Si = 12:15:70:3),
*angle of diffraction due to (111) plane.

TABLE 13

| Experiment No. | Bias voltage (V) | Substrate temperature (° C.) | Nitrogen gas pressure (Pa) | Composition of film (atomic ratio) | | | |
|---|---|---|---|---|---|---|---|
| | | | | Ti | Cr | Al | Si |
| 1 | 50 | 560 | 2.66 | 0.127 | 0.168 | 0.684 | 0.021 |
| 2 | 75 | 585 | 2.66 | 0.129 | 0.171 | 0.673 | 0.027 |
| 3 | 100 | 577 | 2.66 | 0.130 | 0.171 | 0.667 | 0.032 |
| 4 | 125 | 600 | 2.66 | 0.136 | 0.164 | 0.673 | 0.027 |
| 5 | 150 | 594 | 2.66 | 0.131 | 0.158 | 0.683 | 0.028 |
| 6 | 200 | 612 | 2.66 | 0.130 | 0.152 | 0.680 | 0.038 |
| 7 | 250 | 624 | 2.66 | 0.133 | 0.155 | 0.682 | 0.030 |
| 8 | 350 | 650 | 2.66 | 0.136 | 0.154 | 0.684 | 0.026 |
| 9 | 450 | 660 | 2.66 | Excessively thin film | | | |
| 10 | 150 | 580 | 0.30 | 0.125 | 0.155 | 0.691 | 0.029 |
| 11 | 150 | 580 | 1.33 | 0.129 | 0.159 | 0.684 | 0.028 |
| 12 | 150 | 580 | 3.99 | 0.139 | 0.176 | 0.658 | 0.027 |
| 13 | 150 | 580 | 7.80 | Excessively thin film | | | |
| 14 | 150 | 250 | 2.66 | Film peeled | | | |
| 15 | 150 | 480 | 2.66 | 0.130 | 0.169 | 0.673 | 0.028 |
| 16 | 150 | 520 | 2.66 | 0.134 | 0.159 | 0.681 | 0.026 |
| 17 | 150 | 660 | 2.66 | 0.133 | 0.165 | 0.672 | 0.030 |
| 18 | 150 | 850 | 2.66 | 0.135 | 0.174 | 0.662 | 0.029 |

It is noted from Tables 12 and 13 that the samples Nos. 1 to 8, 11, 12, and 15 to 17, which were prepared at an adequately controlled bias voltage, reactant gas pressure, and substrate temperature according to the present invention, are superior in wear resistance (in terms of worn width) to the samples Nos. 9, 10, 13, 14, and 18. This suggests that the coating film has the crystal orientation, the angle of diffraction, and the half width as desired if the film forming conditions are controlled as specified in the present invention. Thus the resulting film has outstanding wear resistance.

Example 12

Film coating was performed on a square end mill of cemented carbide (10 mm in diameter, with two edges) by using a target of alloy composed of Ti (10 at %), Cr (18 at %), and Al (72 at %). A multi-layered film of metal nitride, carbide, carbonitride, or metal as shown in Table 14 was formed on the substrate by using the AIP apparatus (having two evaporating sources) as shown in FIG. 2. The arc current was varied from 100 A to 150 A, the pressure of the reactant gas (nitrogen or a mixture of nitrogen and methane) was varied from 0 Pa (for metal film) to 2.66 Pa, the bias voltage applied to the substrate was varied from 30V to 150V according to the kind of film, and the substrate temperature was kept at 550° C., with other conditions remaining the same as those in Example 1. The multi-layered film was formed by repeating alternate coating with film-1 and film-2 (specified in Table 14) from two evaporating sources. The number of layers shown in Table 14 is counted by regarding "film-1+film-2" as one unit. The total thickness of the multi-layered film was about 3 μm. After the film-forming step was complete, the coating film was examined for wear resistance by cutting test in the same way as in Example 2. The results are shown in Table 14.

TABLE 14

| Experiment No. | Film-1** | Thickness of film-1 (μm) | Film-2 | Thickness of film-2 (μm) | Number of layers | Worn width (μm) |
|---|---|---|---|---|---|---|
| 1 | $Ti_{0.5}Al_{0.5}N$ | 0.5 | TiAlCrN* | 2.5 | 1 | 25 |
| 2 | $Ti_{0.5}Al_{0.5}N$ | 0.05 | TiAlCrN* | 0.05 | 30 | 27 |
| 3 | $Ti_{0.5}Al_{0.5}N$ | 0.005 | TiAlCrN* | 0.005 | 300 | 26 |
| 4 | TiN | 0.5 | TiAlCrN* | 2.5 | 1 | 26 |
| 5 | TiN | 0.05 | TiAlCrN* | 0.05 | 30 | 28 |
| 6 | TiN | 0.005 | TiAlCrN* | 0.005 | 300 | 26 |
| 7 | $Ti_{0.5}Al_{0.5}$ | 0.01 | TiAlCrN* | 3 | 1 | 27 |
| 8 | Ti | 0.1 | TiAlCrN* | 3 | 1 | 25 |
| 9 | Cr | 1 | TiAlCrN* | 2 | 1 | 26 |
| 10 | TiAlCrN* | 1.5 | $Ti_{0.08}Al_{0.74}Cr_{0.18}N$ | 1.5 | 1 | 25 |
| 11 | TiAlCrN* | 0.05 | $Ti_{0.08}Al_{0.74}Cr_{0.18}N$ | 0.05 | 30 | 26 |
| 12 | TiAlCrN* | 0.005 | $Ti_{0.1}Al_{0.75}Cr_{0.15}N$ | 0.005 | 300 | 25 |

*Formed from a TiAlCrN target (Ti:Al:Cr = 10:72:18)
**Formed directly on the substrate It is noted from Table 14 that the multi-layered coating film exhibits outstanding wear resistance (in terms of worn width not larger than 30 μm) so long as each layer meets the requirements of the present invention.

Example 13

In order to demonstrate the effect of multi-layer film, coating with a $Ti_{0.5}Al_{0.5}N$ or $Ti(CO_{0.5}N_{0.5})$ film was made on the coating film (pertaining to the present invention) of each of the end mill samples Nos. 3, 5, 8, 10, and 12 in Example 3. Coating with two films was repeated alternately. The kind of film and the number of layers are shown in Table 15. The total thickness of the multi-layer film was about 3 μm. The thus obtained coating film was examined for wear resistance by cutting test in the same way as in Example 4. The results are shown in Table 16. Incidentally, the TiAlCrSiN film was found to contain metal elements in a ratio of Ti: 13 at %, Al: 68 at %, Cr: 16 at %, and Si: 3 at %.

TABLE 16

| Experiment No. | Film-1** | Thickness of film-1 (μm) | Film-2 | Thickness of film-2 (μm) | Number of layers | Worn width (μm) |
|---|---|---|---|---|---|---|
| 1 | $Ti_{0.5}Al_{0.5}N$ | 0.5 | TiAlCrSiN* | 2.5 | 1 | 20 |
| 2 | $Ti_{0.5}Al_{0.5}N$ | 0.05 | TiAlCrSiN* | 0.05 | 30 | 21.6 |
| 3 | $Ti_{0.5}Al_{0.5}N$ | 0.005 | TiAlCrSiN* | 0.005 | 300 | 20.8 |
| 4 | TiN | 0.5 | TiAlCrSiN* | 2.5 | 1 | 20.8 |
| 5 | TiN | 0.05 | TiAlCrSiN* | 0.05 | 30 | 22.4 |
| 6 | TiN | 0.005 | TiAlCrSiN* | 0.005 | 300 | 20.8 |
| 7 | $Ti_{0.5}Al_{0.5}$ | 0.01 | TiAlCrSiN* | 3 | 1 | 21.6 |
| 8 | Ti | 0.1 | TiAlCrSiN* | 3 | 1 | 20 |
| 9 | Cr | 1 | TiAlCrSiN* | 2 | 1 | 20.8 |
| 10 | TiAlCrSiN* | 1.5 | $Ti_{0.13}Al_{0.7}Cr_{0.15}Si_{0.02}N$ | 1.5 | 1 | 20 |
| 11 | TiAlCrSiN* | 0.05 | $Ti_{0.13}Al_{0.7}Cr_{0.15}Si_{0.02}N$ | 0.05 | 30 | 20.8 |
| 12 | TiAlCrSiN* | 0.005 | $Ti_{0.1}Al_{0.74}Cr_{0.14}Si_{0.02}N$ | 0.005 | 300 | 20 |

*Formed from a TiAlCrSiN target (Ti:Al:Cr:Si = 12:70:15:3).
**Formed directly on the substrate resistance by cutting test in the same way as in Example 4. The results are shown in Table 15.

TABLE 15

| Experiment No. | Multi-layer structure (upper layer/lower layer) | Number of layers | Worn width (μm) |
|---|---|---|---|
| 3 | $Ti_{0.02}Cr_{0.1}Al_{0.85}Si_{0.03}N/Ti(C_{0.5}N_{0.5})$ | 2 | 32 |
| 5 | $Ti_{0.1}Cr_{0.18}Al_{0.72}N/Ti_{0.5}Al_{0.5}N$ | 10 | 23 |
| 8 | $Ti_{0.11}Cr_{0.15}Al_{0.71}Si_{0.03}N/Ti_{0.5}Al_{0.5}N$ | 2 | 16 |
| 10 | $Ti_{0.13}Cr_{0.15}Al_{0.70}Si_{0.02}N/Ti_{0.5}Al_{0.5}N$ | 10 | 15 |
| 12 | $Ti_{0.18}Cr_{0.08}Al_{0.71}Si_{0.03}C_{0.2}N_{0.8}/Ti_{0.5}Al_{0.5}N$ | 10 | 18 |

It is noted from Table 15 that the multi-layered coating film (in the samples Nos. 5, 8, 10, and 12) exhibits better wear resistance (in terms of worn width) than the sample No. 3 so long as each layer meets the requirements of the present invention.

Example 14

Film coating was performed on a square end mill of cemented carbide (10 mm in diameter, with four edges) by using a target of alloy composed of Ti (12 at %), Cr (15 at %), Al (70 at %), and Si (3 at %). A multi-layered film of metal nitride, carbide, carbonitride, or metal as shown in Table 16 was formed on the substrate by using the AIP apparatus (having two evaporating sources) as shown in FIG. 2. The arc current was varied from 100 A to 150 A, the pressure of the reactant gas (nitrogen or a mixture of nitrogen and methane) was varied from 0 Pa (for metal film) to 2.66 Pa, the bias voltage applied to the substrate was varied from 30V to 150V according to the kind of film, and the substrate temperature was kept at 550° C., with other conditions remaining the same as those in Example 3. The multi-layered film was formed by repeating alternate coating with film-1 and film-2 (specified in Table 16) from two evaporating sources. The number of layers shown in Table 16 is counted by regarding "film-1+film-2" as one unit. The total thickness of the multi-layered film was about 3 μm.

It is noted from Table 16 that the multi-layered coating film (in the samples Nos. 1 to 12) exhibits good wear resistance (in terms of worn width smaller than 30 μm) so long as each layer meets the requirements of the present invention.

Example 15

Film coating was performed on a chip of cemented carbide or a square end mill of cemented carbide (10 mm in diameter, with two edges) by using a target of alloy composed of Ti (9 at %), Cr (19 at %), and Al (72 at %). The conditions of film coating were the same as those in Example 1 except that the duration of film forming was 30 minutes, the arc current was 100 A, the substrate temperature was 500° C., and the bias voltage was varied in the range of 50V to 400V so that the substrate was kept negative with respect to earth potential. The resulting film was examined for crystal structure by X-ray diffraction. The coated chip was broken and the fracture surface was observed under a scanning electron microscope to measure the thickness of the coating film. The coating film was examined for wear resistance by cutting test in the same way as in Example 2. The results are shown in Table 17. Incidentally, the analysis by EMPA revealed that the coating film is composed of Ti: 9–11 at %, Cr: 19–21 at %, and Al: 68–71 at %, depending on the bias voltage applied at the time of film forming.

TABLE 17

| Experiment No. | Bias voltage (V) | Film thickness (μm) | Crystal structure* | Worn width (μm) |
|---|---|---|---|---|
| 1 | 50 | 4.3 | B1 + Hex | 35 |
| 2 | 70 | 4.1 | B1 | 25 |
| 3 | 150 | 3.8 | B1 | 20 |
| 4 | 250 | 3.3 | B1 | 22 |
| 5 | 300 | 2.5 | B1 | 23 |
| 6 | 350 | 0.7 | B1 | 29 |

TABLE 17-continued

| Experiment No. | Bias voltage (V) | Film thickness (μm) | Crystal structure* | Worn width (μm) |
|---|---|---|---|---|
| 7 | 400 | Film forming almost impossible | Not identified | — |

*B1 represents sodium chloride structure, and Hex represents ZnS structure.

It is noted from Table 17 that the samples Nos. 2 to 5, which were prepared with a bias voltage within the range specified by the present invention, have the optimum crystal structure and film thickness. By contrast, the sample No. 1, which was prepared with a bias voltage lower than that specified in the present invention, has a mixed crystal structure of B1 and Hex and hence is poor in wear resistance. Also, the samples Nos. 6 and 7, which were prepared with a bias voltage higher than that specified in the present invention, have a thin film. Those samples meeting the requirements (for bias voltage) of the present invention were superior in wear resistance.

Example 16

Film coating (approximately 3 μm thick) was performed on substrates by using the AIP apparatus shown in FIG. 2. The substrates, the composition of film, and the composition of alloy targets are shown below.

Substrates:
Chips of cemented carbide, or ball end mill of cemented carbide (10 mm in diameter, 5 mm in center radius, with two edges)

Composition of Film:
TiAlCrN, TiAlN, TiN, or CrN

Composition of Alloy Targets:
Ti: 10 at %, Cr: 18 at %, Al: 72 at %; Ti: 50 at %, Al: 50 at %; pure Ti metal; or pure Cr metal The bias voltage applied to the substrate was 150 V for TiAlCrN film and 50V for TiAlN film or TiN film. The film-forming conditions were the same as those in Example 1, except that the substrate temperature was varied from 550° C. to 580° C., the arc current was 150 A, and the pressure of the reactant gas (nitrogen gas) was 2.66 Pa.

After the film-forming step was complete, the resulting film was examined for composition, Vickers hardness, and wear resistance. Wear resistance was measured by actual cutting under the following conditions. Wear resistance is rated in terms of the worn width at the tip of the ball end mill and the worn width at the boundary.

Cutting Conditions:
Work: S55C (with a Brinell hardness of 220)
Cutting speed: 100 m/min
Feed speed: 0.05 mm/edge
Depth of cut: 4.5 mm
Pick feed: 0.5 mm
Cut length: 30 meters Analyses by EPMA revealed that the resulting TiCrAlN film and TiAlN film have the composition of $(Ti_{0.1}Cr_{0.22}Al_{0.68})N$ and $(Ti_{0.54}Al_{0.46})N$, respectively, in which the amount of Al is slightly less than that in the alloy target. The atomic ratio of metal elements and nitrogen atoms in the films was in the range of from 0.9 to 1.1.

TABLE 18

| Experiment No. | Film | Bias voltage (V) | Temperature (° C.) | Pressure of reactant gas (Pa) | Hardness of film | Worn width of tip (μm) | Worn width at boundary (μm) |
|---|---|---|---|---|---|---|---|
| 1 | TiAlCrN*1 | 150 | 550 | 2.66 | 3250 | 152 | 48 |
| 2 | TiAlN*2 | 50 | 550 | 2.66 | 2900 | 320 | 85 |
| 3 | TiN | 50 | 550 | 2.66 | 2300 | 188 | 491 |
| 4 | CrN | 50 | 550 | 2.66 | 1450 | 370 | 571 |

*1Target: TiAlCr (Ti:Al:Cr = 10:72:18)
*2Target: TiAl (Ti:Al = 50:50)

It is noted from Table 18 that the coating film meeting the requirements of the present invention is superior to conventional TiAlN, TiN, and CrN films as indicated by the smaller amount of wear at the tip and at the boundary in the cutting test with S55C (HB 220).

Example 17

A series of experiments were carried out as follows to see how discharging is affected at the time of film forming by the relative density of the target and the content of impurities in the target. Targets each having the composition shown in Table 19 were prepared from a mixture of Ti powder, Cr powder, and Al powder (all under 100 mesh) by HIP (hot isostatic pressing) at 900° C. and $8 \times 10^7$ Pa. The composition of the target was determined by ICP-MS. The target, measuring 254 mm in outside diameter and 5 mm in thickness, was tested for discharging characteristics by reactive sputtering (with nitrogen reactant gas at 500 W) to form a film (3 μm thick) on a chip of cemented carbide.

The resulting hard film was analyzed by XPS and examined for wear resistance by cutting test under the following conditions. The state of discharging at the time of film forming was evaluated by visually observing how discharge occurs on the surface and by monitoring the discharge voltage. The results are shown in Table 19.

Cutting Conditions:
Work: JIS-SKD61 (HRC50)
End mill: cemented carbide, with four edges
Cutting speed: 200 m/min
Depth of cut: 1 mm Feed speed: 0.05 mm/edge Length of cut: 20 m Rating of Wear Resistance:

⊙: face wear less than 25 μm

○: face wear ranging from 25 μm to 50 μm

Δ: face wear not less than 50 μm

Rating of Discharging State:

Stable: there is no instantaneous increase in discharge voltage, or there is no uneven distribution of discharges from one place to another.

Slightly unstable: there is an instantaneous increase in discharge voltage, or there is some uneven distribution of discharges from one place to another.

Unstable: there is a considerable instantaneous increase in discharge voltage, or there is considerable uneven distribution of discharges from one place to another.

Interrupted: there is an interruption of discharge during operation.

TABLE 19

| Experiment No. | Composition of target (atomic ratio) | | | Relative density (%) | State of discharge | Composition of film (atomic ratio) | | | Rate of film forming (μm/h) | Wear resistance |
| --- | --- | --- | --- | --- | --- | --- | --- | --- | --- | --- |
|  | Ti | Cr | Al |  |  | Ti | Cr | Al |  |  |
| 1 | 0.26 | 0.06 | 0.68 | 99.8 | stable | 0.26 | 0.06 | 0.68 | 1.50 | ⊙ |
| 2 | 0.20 | 0.07 | 0.73 | 99.5 | stable | 0.20 | 0.07 | 0.73 | 1.61 | ⊙ |
| 3 | 0.18 | 0.06 | 0.76 | 99.2 | stable | 0.18 | 0.06 | 0.76 | 1.68 | ○ |
| 4 | 0.08 | 0.14 | 0.78 | 99.2 | stable | 0.08 | 0.14 | 0.78 | 1.72 | ○ |
| 5 | 0.01 | 0.18 | 0.81 | 99.6 | stable | 0.01 | 0.18 | 0.81 | 1.79 | ○ |
| 6 | 0.17 | 0.11 | 0.72 | 99.7 | stable | 0.17 | 0.11 | 0.72 | 1.59 | ⊙ |
| 7 | 0.08 | 0.18 | 0.74 | 99.0 | stable | 0.08 | 0.18 | 0.74 | 1.63 | ⊙ |
| 8 | 0.26 | 0.06 | 0.68 | 94.0 | unstable | 0.24 | 0.12 | 0.62 | 1.50 | Δ |
| 9 | 0.08 | 0.14 | 0.78 | 92.3 | unstable | 0.12 | 0.16 | 0.70 | 1.72 | Δ |
| 10 | 0.17 | 0.11 | 0.72 | 90.2 | interrupted |  |  |  | not measurable |  |

It is noted from Table 19 that the samples Nos. 1 to 7, which have the relative density meeting the requirements of the present invention, permit satisfactory discharging. As the result they yielded coating film superior in wear resistance and having the same composition as the target. It is also noted from Table 19 that the samples Nos. 8 to 10, which have the relative density outside the range specified in the present invention, gave unstable discharge or caused discharge to be interrupted. As the result, they yielded coating film poor in wear resistance and having the composition greatly different from that of the target.

Example 18

A series of experiments were carried out as follows to see how discharging is affected at the time of film forming by the relative density of the target and the content of impurities in the target. Targets each having the composition shown in Table 20 were prepared from a mixture of Ti powder, Cr powder, Al powder, and Si powder (all under 100 mesh) by HIP (hot isostatic pressing) at 900° C. and 8×10$^7$ Pa. The composition of the target was determined by ICP-MS. The target, measuring 254 mm in outside diameter and 5 mm in thickness, was tested for discharging characteristics by reactive sputtering (with nitrogen reactant gas at 500 W) to form a film (about 3 μm thick) on a chip of cemented carbide.

The resulting hard film was analyzed by XPS and examined for wear resistance by cutting test under the following conditions. The state of discharging at the time of film forming was evaluated by visually observing how discharge occurs on the surface and by monitoring the discharge voltage. The results are shown in Table 20.

Cutting Conditions:

Work: JIS-SKD61 (HRC50)

End mill: cemented carbide, with four edges

Cutting speed: 200 m/min

Depth of cut: 1 mm

Feed speed: 0.05 mm/edge

Length of ct: 30 m

Rating of Wear Resistance:

○: face wear less than 20 μm

×: face wear not less than 20 μm

Rating of Discharging State:

Stable: there is no instantaneous increase in discharge voltage, or there is no uneven distribution of discharges from one place to another.

Slightly unstable: there is an instantaneous increase in discharge voltage, or there is some uneven distribution of discharges from one place to another.

Unstable: there is a considerable instantaneous increase in discharge voltage, or there is considerable uneven distribution of discharges from one place to another.

Interrupted: there is an interruption of discharge during operation.

TABLE 20

| Experiment No. | Composition of target (atomic ratio) | | | | Relative density (%) | State of discharge | Composition of film (atomic ratio) | | | | Wear resistance |
|---|---|---|---|---|---|---|---|---|---|---|---|
| | Ti | Cr | Al | Si | | | Ti | Cr | Al | Si | |
| 1 | 0.28 | 0.18 | 0.52 | 0.02 | 99.8 | stable | 0.30 | 0.18 | 0.50 | 0.02 | ◯ |
| 2 | 0.10 | 0.15 | 0.72 | 0.03 | 99.5 | stable | 0.11 | 0.15 | 0.71 | 0.03 | ◯ |
| 3 | 0.02 | 0.20 | 0.72 | 0.06 | 99.2 | stable | 0.04 | 0.20 | 0.70 | 0.06 | ◯ |
| 4 | 0.11 | 0.15 | 0.72 | 0.02 | 99.2 | stable | 0.13 | 0.15 | 0.70 | 0.02 | ◯ |
| 5 | 0.16 | 0.08 | 0.73 | 0.03 | 99.6 | stable | 0.18 | 0.08 | 0.71 | 0.03 | ◯ |
| 6 | 0.16 | 0.08 | 0.73 | 0.03 | 99.7 | stable | 0.18 | 0.08 | 0.71 | 0.03 | ◯ |
| 7 | 0.16 | 0.08 | 0.73 | 0.03 | 99.0 | stable | 0.18 | 0.08 | 0.71 | 0.03 | ◯ |
| 8 | 0.10 | 0.15 | 0.72 | 0.03 | 94.0 | unstable | 0.10 | 0.20 | 0.65 | 0.05 | X |
| 9 | 0.11 | 0.15 | 0.72 | 0.02 | 92.3 | unstable | 0.19 | 0.25 | 0.55 | 0.01 | X |
| 10 | 0.16 | 0.08 | 0.73 | 0.03 | 90.2 | interrupted | Not measurable | | | | |

It is noted from Table 20 that the samples Nos. 1 to 7, which have the relative density meeting the requirements of the present invention, permit satisfactory discharging. As the result they yielded coating film superior in wear resistance and having the same composition as the target. It is also noted from Table 20 that the samples Nos. 8 to 10, which have the relative density outside the range specified in the present invention, gave unstable discharge or caused discharge to be interrupted. As the result, they yielded coating film poor in wear resistance and having the composition greatly different from that of the target.

Example 19

Targets each having the composition shown in Table 21 were prepared from a mixture of Ti powder (under 100 mesh), Cr powder (under 100 mesh), and Al powder (under 240 mesh) by HIP (hot isostatic pressing) at 500–900° C. and 8×10$^7$ Pa. To the bottom of the target was attached by brazing a flange (104 mm in outside diameter and 2 mm in thickness) which is a copper backing plate. (Alternatively, the flange was formed by machining the target.) The target was mounted on an ion-plating apparatus of arc discharge type. Using this target, a 3-μm thick film was formed on a chip of cemented carbide under the following conditions.

Reactant gas: nitrogen or a mixture of nitrogen and methane.
Substrate temperature: 500° C.
Arc current: 100 A
Bias voltage applied to the substrate: 150V The target was analyzed for composition by ICP-MS. The film was examined for wear resistance by cutting test in the same way as in Example 17. Analyses by XPS revealed that the resulting film has almost the same composition as that of the target (with a difference within ±2 at %). The target was examined for voids (defects) and their size by ultrasonic test. The state of discharging at the time of film forming was evaluated in the same way as in Example 17. The results are shown in Table 21.

TABLE 21

| Experiment No. | Composition of target (atomic ratio) | | | Relative density (%) | Voids (size) | Backing plate | State of discharging | Rate of film forming (μm/h) | Wear resistance |
|---|---|---|---|---|---|---|---|---|---|
| | Ti | Cr | Al | | | | | | |
| 1 | 0.26 | 0.06 | 0.68 | 99.8 | <0.3 mm | no | stable | 3.20 | ⊙ |
| 2 | 0.20 | 0.07 | 0.73 | 99.5 | <0.3 mm | no | stable | 3.44 | ⊙ |
| 3 | 0.18 | 0.06 | 0.76 | 99.2 | <0.3 mm | no | stable | 3.58 | ◯ |
| 4 | 0.08 | 0.14 | 0.78 | 98.2 | <0.3 mm | no | stable | 3.67 | ◯ |
| 5 | 0.01 | 0.18 | 0.81 | 96.5 | voids not smaller than 0.3 mm | no | unstable | 3.81 | Δ |
| 6 | 0.17 | 0.11 | 0.72 | 92.7 | voids not smaller than 0.3 mm | no | interrupted | — | — |
| 7 | 0.08 | 0.18 | 0.74 | 97.0 | voids not smaller than 0.3 mm | no | slightly unstable | 3.43 | ⊙ |
| 8 | 0.26 | 0.06 | 0.68 | 94.1 | voids penetrating from front to back | no | interrupted | — | — |
| 9 | 0.08 | 0.14 | 0.78 | 92.3 | <0.3 mm | yes | unstable | 3.67 | Δ |
| 10 | 0.17 | 0.11 | 0.72 | 90.2 | <0.3 mm | yes | interrupted | — | Not measurable |

It is noted from Table 21 that the samples Nos. 1 to 4, which meet the requirements for the relative density of the target and the size of voids in the target as specified in the present invention, permit stable discharging at the time of film forming and yield film with good wear resistance. By contrast, in the case of the samples Nos. 5 and 7, which do not meet the requirements for the size of voids in the target as specified in the present invention, the samples Nos. 9 and 10, which do not meet the requirements for the relative density of the target as specified in the present invention, and the samples Nos. 6 and 8, which do not meet the requirements for the relative density of the target and the size of voids in the target as specified in the present invention, discharging was unstable or interrupted at the time of film forming and film forming was impossible to carry out or the resulting film was poor in wear resistance.

Example 20

Targets each having the composition shown in Table 22 were prepared from a mixture of Ti powder (under 100 mesh), Cr powder (under 100 mesh), Al powder (under 240 mesh), and Si powder (under 100 mesh) by HIP (hot isostatic pressing) at 500–900° C. and $8 \times 10^7$ Pa. To the bottom of the target was attached by brazing a flange (104 mm in outside diameter and 2 mm in thickness) which is a copper backing plate. (Alternatively, the flange was formed by machining the target.) The target was mounted on an ion-plating apparatus of arc discharge type. Using this target, an approximately 3-$\mu$m thick film was formed on a chip of cemented carbide under the following conditions.
Reactant gas: nitrogen or a mixture of nitrogen and methane.
Substrate temperature: 500° C.
Arc current: 100 A
Bias voltage applied to the substrate: −150V The target was analyzed for composition by atomic absorption spectrometry. The film was examined for wear resistance by cutting test in the same way as in Example 18. Analyses by XPS revealed that the resulting film has almost the same composition as that of the target (with a difference within ±2 at %). The target was examined for voids (defects) and their size by ultrasonic test. The state of discharging at the time of film forming was evaluated in the same way as in Example 18. The results are shown in Table 22.

It is noted from Table 22 that the samples Nos. 1 to 4, which meet the requirements for the relative density of the target and the size of voids in the target as specified in the present invention, permit stable discharging at the time of film forming and yield film with good wear resistance. By contrast, in the case of the samples Nos. 5 and 7, which do not meet the requirements for the size of voids in the target as specified in the present invention, the samples Nos. 9 and 10, which do not meet the requirements for the relative density of the target as specified in the present invention, and the samples Nos. 6 and 8, which do not meet the requirements for the relative density of the target and the size of voids in the target as specified in the present invention, discharging was unstable or interrupted at the time of film forming and film forming was impossible to carry out or the resulting film was poor in wear resistance.

Example 21

A series of experiments were carried out to investigate how the state of discharging at the time of film forming is affected by the content of impurities (oxygen, hydrogen, chlorine, copper, and magnesium) in the target.

Targets each having the composition shown in Table 23 were prepared in the same way as in Example 19. All of the resulting targets have a relative density not lower than 99% and are free of voids (larger than 0.3 mm) and continuous defects. Using the targets, film forming was carried out in the same way as in Example 19, except that the reactant gas was nitrogen alone. The amount of impurities in the target was determined by atomic absorption spectrometry. The state of discharging at the time of film forming was evaluated in the same way as in Example 17.

TABLE 22

| Experiment No. | Composition of target (atomic ratio) | | | | Relative density (%) | Voids (size) | Backing plate | State of discharging | Wear resistance |
|---|---|---|---|---|---|---|---|---|---|
| | Ti | Cr | Al | Si | | | | | |
| 1 | 0.28 | 0.18 | 0.52 | 0.02 | 99.8 | <0.3 mm | no | stable | ◯ |
| 2 | 0.10 | 0.15 | 0.72 | 0.03 | 99.5 | <0.3 mm | no | stable | ◯ |
| 3 | 0.02 | 0.20 | 0.72 | 0.06 | 99.2 | <0.3 mm | no | stable | ◯ |
| 4 | 0.11 | 0.15 | 0.72 | 0.02 | 98.2 | <0.3 mm | no | stable | ◯ |
| 5 | 0.28 | 0.18 | 0.52 | 0.02 | 96.5 | voids not smaller than 0.3 mm | no | unstable | X |
| 6 | 0.10 | 0.15 | 0.72 | 0.03 | 92.7 | voids not smaller than 0.3 mm | no | interrupted | — |
| 7 | 0.02 | 0.20 | 0.72 | 0.06 | 97.0 | voids not smaller than 0.3 mm | no | slightly unstable | ◯ |
| 8 | 0.11 | 0.15 | 0.72 | 0.02 | 94.1 | voids penetrating from front to back | no | interrupted | — |
| 9 | 0.16 | 0.08 | 0.73 | 0.03 | 92.3 | <0.3 mm | yes | unstable | X |
| 10 | 0.16 | 0.08 | 0.73 | 0.03 | 90.2 | <0.3 mm | yes | interrupted | Not measurable |

TABLE 23

| Experiment No. | Composition of target (mass %) | | | | | | | | State of discharging |
|---|---|---|---|---|---|---|---|---|---|
| | Ti | Cr | Al | O | H | Cl | Cu | Mg | |
| 1 | 37.48 | 10.55 | 51.60 | 0.28 | 0.02 | 0.03 | 0.03 | 0.01 | stable |
| 2 | 29.97 | 12.39 | 57.07 | 0.31 | 0.03 | 0.17 | 0.04 | 0.02 | slightly unstable |
| 3 | 27.76 | 11.10 | 60.89 | 0.07 | 0.01 | 0.14 | 0.01 | 0.02 | stable |
| 4 | 13.16 | 23.81 | 62.61 | 0.22 | 0.05 | 0.08 | 0.03 | 0.03 | stable |
| 5 | 2.97 | 30.66 | 66.16 | 0.10 | 0.03 | 0.04 | 0.03 | 0.01 | stable |
| 6 | 25.42 | 18.40 | 55.69 | 0.26 | 0.02 | 0.15 | 0.05 | 0.01 | stable |
| 7 | 12.76 | 29.25 | 57.51 | 0.28 | 0.04 | 0.12 | 0.02 | 0.02 | stable |
| 8 | 5.78 | 32.93 | 61.03 | 0.14 | 0.04 | 0.03 | 0.04 | 0.01 | stable |
| 9 | 37.24 | 17.33 | 44.95 | 0.23 | 0.01 | 0.19 | 0.03 | 0.02 | stable |
| 10 | 24.00 | 28.94 | 46.56 | 0.33 | 0.02 | 0.13 | 0.01 | 0.01 | stable |
| 11 | 15.03 | 32.64 | 51.58 | 0.52 | 0.03 | 0.14 | 0.04 | 0.02 | slightly unstable |
| 12 | 13.23 | 40.21 | 46.20 | 0.16 | 0.07 | 0.10 | 0.03 | 0.01 | slightly unstable |
| 13 | 4.76 | 49.09 | 45.59 | 0.24 | 0.01 | 0.28 | 0.01 | 0.02 | slightly unstable |
| 14 | 5.29 | 47.34 | 46.90 | 0.30 | 0.03 | 0.06 | 0.07 | 0.01 | slightly unstable |
| 15 | 22.02 | 35.16 | 42.33 | 0.28 | 0.02 | 0.13 | 0.02 | 0.04 | slightly unstable |
| 16 | 12.72 | 46.94 | 40.12 | 0.10 | 0.04 | 0.03 | 0.03 | 0.02 | stable |
| 17 | 5.11 | 52.68 | 41.73 | 0.25 | 0.01 | 0.17 | 0.04 | 0.01 | stable |
| 18 | 4.74 | 48.90 | 45.40 | 0.66 | 0.03 | 0.18 | 0.03 | 0.06 | slightly unstable |
| 19 | 23.95 | 28.89 | 46.48 | 0.27 | 0.04 | 0.22 | 0.08 | 0.07 | slightly unstable |

It is noted from Table 23 that the samples Nos. 1, 3 to 9, 16, and 17, permit good state of discharging, because they meet the requirements for the content of impurities (oxygen, hydrogen, chlorine, copper, and magnesium) as specified in the present invention. By contrast, other samples are poor in state of discharging because they do not meet the requirements specified in the present invention. That is, the samples Nos. 2, 10, and 11 contain oxygen more than specified, the sample No. 12 contains hydrogen more than specified, the sample No. 13 contains chlorine more than specified, the sample No. 14 contains copper more than specified, the sample No. 15 contains magnesium more than specified, the sample No. 18 contains oxygen and magnesium more than specified, and the sample No. 19 contains chlorine, copper, and magnesium more than specified. This result indicates that it is necessary that the target should not contain impurities (oxygen, hydrogen, chlorine, copper, and magnesium) more than specified in the present invention in order to form the hard film on cutting tools efficiently under good discharging state during film forming.

Example 22

A series of experiments were carried out to investigate how the state of discharging at the time of film forming is affected by the content of impurities (oxygen, hydrogen, chlorine, copper, and magnesium) in the target.

Targets each having the composition shown in Table 24 were prepared in the same way as in Example 18. All of the resulting targets have a relative density not lower than 99% and are free of voids (not smaller than 0.3 mm) and continuous defects. Using the targets, film forming was carried out in the same way as in Example 18. The amount of impurities in the target was determined by atomic absorption spectrometry. The state of discharging at the time of film forming was evaluated in the same way as in Example 18.

TABLE 24

| Experiment No. | Composition of target (mass %) | | | | | | | | | State of discharging |
|---|---|---|---|---|---|---|---|---|---|---|
| | Ti | Cr | Al | Si | O | H | Cl | Cu | Mg | |
| 1 | 35.763 | 24.957 | 37.41 | 1.50 | 0.28 | 0.02 | 0.03 | 0.03 | 0.01 | stable |
| 2 | 14.494 | 23.601 | 58.785 | 2.5496 | 0.31 | 0.03 | 0.17 | 0.04 | 0.02 | slightly unstable |
| 3 | 2.9431 | 31.95 | 59.682 | 5.1771 | 0.07 | 0.01 | 0.14 | 0.01 | 0.02 | stable |
| 4 | 15.874 | 23.497 | 58.527 | 1.6923 | 0.22 | 0.05 | 0.08 | 0.03 | 0.03 | stable |
| 5 | 23.632 | 12.826 | 60.734 | 2.5981 | 0.1 | 0.03 | 0.04 | 0.03 | 0.01 | stable |
| 6 | 23.566 | 12.79 | 60.563 | 2.5908 | 0.26 | 0.02 | 0.15 | 0.05 | 0.01 | stable |
| 7 | 23.568 | 12.792 | 60.569 | 2.5911 | 0.28 | 0.04 | 0.12 | 0.02 | 0.02 | stable |
| 8 | 35.803 | 24.984 | 37.454 | 1.4995 | 0.14 | 0.04 | 0.03 | 0.04 | 0.01 | stable |
| 9 | 14.508 | 23.622 | 58.838 | 2.5519 | 0.23 | 0.01 | 0.19 | 0.03 | 0.02 | stable |
| 10 | 2.94 | 31.868 | 59.532 | 5.1641 | 0.33 | 0.02 | 0.13 | 0.01 | 0.01 | slightly unstable |
| 11 | 15.82 | 23.417 | 58.327 | 1.6865 | 0.52 | 0.03 | 0.14 | 0.04 | 0.02 | slightly unstable |
| 12 | 23.594 | 12.806 | 60.64 | 2.59 | 0.16 | 0.07 | 0.1 | 0.03 | 0.01 | slightly unstable |
| 13 | 23.549 | 12.781 | 60.521 | 2.589 | 0.24 | 0.01 | 0.28 | 0.01 | 0.02 | slightly unstable |
| 14 | 23.57 | 12.793 | 60.58 | 2.59 | 0.3 | 0.03 | 0.06 | 0.07 | 0.01 | slightly unstable |
| 15 | 2.963 | 31.871 | 59.538 | 5.1646 | 0.28 | 0.02 | 0.13 | 0.02 | 0.04 | slightly unstable |
| 16 | 15.904 | 23.542 | 58.638 | 1.6955 | 0.1 | 0.04 | 0.03 | 0.03 | 0.02 | stable |
| 17 | 23.568 | 12.792 | 60.569 | 2.5911 | 0.25 | 0.01 | 0.17 | 0.04 | 0.01 | stable |
| 18 | 23.454 | 12.73 | 60.28 | 2.58 | 0.66 | 0.03 | 0.18 | 0.03 | 0.06 | slightly unstable |
| 19 | 23.521 | 12.766 | 60.448 | 2.5858 | 0.27 | 0.04 | 0.22 | 0.08 | 0.07 | slightly unstable |

It is noted from Table 24 that the samples Nos. 1, 3 to 9, 16, and 17, permit good state of discharging, because they meet the requirements for the content of impurities (oxygen, hydrogen, chlorine, copper, and magnesium) as specified in the present invention. By contrast, other samples are poor in state of discharging because they do not meet the requirements specified in the present invention. That is, the samples Nos. 2, 10, and 11 contain oxygen more than specified, the sample No. 12 contains hydrogen more than specified, the sample No. 13 contains chlorine more than specified, the sample No. 14 contains copper more than specified, the sample No. 15 contains magnesium more than specified, the sample No. 18 contains oxygen and magnesium more than specified, and the sample No. 19 contains chlorine, copper, and magnesium more than specified. This result indicates that it is necessary that the target should not contain impurities (oxygen, hydrogen, chlorine, copper, and magnesium) more than specified in the present invention in order to form the hard film on cutting tools efficiently under good discharging state during film forming.

[Effect of the invention] The present invention which specifies the composition for Ti, Al, Cr, Si, and B as mentioned above yields hard film for cutting tools which is superior in wear resistance to conventional ones. The hard film contributes to long-life cutting tools for high-speed cutting and also for cutting hard steel (such as quenched steel).

This application is based on patent application Nos. 2001-287587, 2001-185464, 2000-402555, 2001-310562, and 2001-185465 filed in Japan, the contents of which are hereby incorporated by references.

What is claimed is:

1. A hard film for cutting tools which is composed of $(Ti_{1-a-b}, Al_a, Cr_b)(C_{1-e}N_e)$ $0.02 \leq 1-a-b < 0.20, 0.06 \leq b \leq 0.20,$ $a+b<1, 0 \leq e \leq 1$ wherein a and b denote respectively the atomic ratios of Al, and Cr, and e denotes the atomic ratio of N.

2. The hard film for cutting tools as defined in claim 1, wherein the values of a and b are in the range of $0.02 \leq 1-a-b < 0.20, 0.65 \leq a \leq 0.765, 0.06 \leq b \leq 020,$ or $0.02 \leq 1-a-b \leq 0.175, 0.765 \leq a, 4(a-0.75) \leq b \leq 0.20.$ 3. The hard film for cutting tools as defined in claim 1, wherein the value of e is 1.

4. The hard film for cutting tools as defined in claim 1, which has the crystal structure mainly of sodium chloride structure.

5. The hard film for cutting tools as defined in claim 1, wherein the sodium chloride structure is one which has the (111) plane, (200) plane, and (220) plane such that the intensity of diffracted rays from them measured by X-ray diffraction (θ–2θ method), which is denoted by I(111), I(200), and I(220), respectively, satisfies expression (1) and/or expression (2) and expression (3) given below.

$I(220) \leq I(111)$ (1)

$I(220) \leq I(200)$ (2)

$I(200) \leq I(111) \geq 0.1$ (3)

6. The hard film for cutting tools as defined in claim 1, wherein the sodium chloride structure is one which, when measured by X-ray diffraction (θ–2θ method) with Cu Kα line, gives the diffracted ray from the (111) plane whose angle of diffraction is in the range of from 36.5° to 38.0°.

7. The hard film for cutting tools as defined in claim 6, wherein the diffracted ray from the (111) plane has a half width not larger than 1°.

8. A hard film for cutting tools which is composed of $(Ti_{1-a-b}, Al_a, Cr_b)(C_{1-e}N_e)$ $0.20 \leq 1-a-b < 0.30, 0.60 < a, 0.06 \leq b \leq 020,$ $a+b<1, 0 \leq e \leq 1$ wherein a and b denote respectively the atomic ratios of Al, and Cr, and e denotes the atomic ratio of N.

9. The hard film for cutting tools as defined in claim 8, wherein the value of e is 1.

10. The hard film for cutting tools as defined in claim 8, which has the crystal structure mainly of sodium chloride structure.

11. The hard film for cutting tools as defined in claim 8, wherein the sodium chloride structure is one which has the (111) plane, (200) plane, and (220) plane such that the intensity of diffracted rays from them measured by X-ray diffraction (θ–2θ method), which is denoted by I(111), I(200), and I(220), respectively, satisfies expression (1) and/or expression (2) and expression (3) given below.

$I(220) \leq I(111)$ (1)

$I(220) \leq I(200)$ (2)

$I(200)/I(111) \geq 0.1$ (3)

12. The hard film for cutting tools as defined in claim 8, wherein the sodium chloride structure is one which, when measured by X-ray diffraction (θ–2θ method) with Cu Kα line, gives the diffracted ray from the (111) plane whose angle of diffraction is in the range of from 36.5° to 38.0°.

13. The hard film for cutting tools as defined in claim 12, wherein the diffracted ray from the (111) plane has a half width not larger than 1°.

\* \* \* \* \*

UNITED STATES PATENT AND TRADEMARK OFFICE
CERTIFICATE OF CORRECTION

PATENT NO. : 6,919,288 B2
DATED : July 19, 2005
INVENTOR(S) : Yamamoto et al.

It is certified that error appears in the above-identified patent and that said Letters Patent is hereby corrected as shown below:

<u>Title page,</u>
Item [73], Assignee, should read:
-- [73] Assignee: Kabushiki Kaisha Kobe Seiko Sho (Kobe Steel, Ltd.), Kobe (JP) --.

Signed and Sealed this

Thirtieth Day of August, 2005

JON W. DUDAS
*Director of the United States Patent and Trademark Office*